US012713879B2

(12) United States Patent
Tseng et al.

(10) Patent No.: US 12,713,879 B2
(45) Date of Patent: Aug. 18, 2026

(54) SYSTEM AND METHOD FOR DETECTING SEMICONDUCTOR PROCESSING ERROR

(71) Applicant: Taiwan Semiconductor Manufacturing Company Limited, Hsin-Chu (TW)

(72) Inventors: Chen Tseng, Tainan City (TW); Yang-Shu Lin, Hsinchu City (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 669 days.

(21) Appl. No.: 18/209,106

(22) Filed: Jun. 13, 2023

(65) Prior Publication Data

US 2024/0421005 A1 Dec. 19, 2024

(51) Int. Cl.
*G06T 7/00* (2017.01)
*G06T 7/246* (2017.01)
(Continued)

(52) U.S. Cl.
CPC ............ *H10P 74/20* (2026.01); *G06T 7/0004* (2013.01); *G06T 7/246* (2017.01); *H10P 76/204* (2026.01);
(Continued)

(58) Field of Classification Search
None
See application file for complete search history.

(56) References Cited

U.S. PATENT DOCUMENTS 8,193,031 B2 * 6/2012 Hosoba ............... H10P 14/3426 438/149
8,324,626 B2 * 12/2012 Kimura ................ H10D 86/423 438/34

(Continued)

FOREIGN PATENT DOCUMENTS

CN 1841213 A * 10/2006 .............. H10P 50/71
CN 108701657 A * 10/2018 .............. C08J 3/244

(Continued)

OTHER PUBLICATIONS

Office Action cited in corresponding Taiwanese patent Application No. 112130098, dated Mar. 26, 2024, 38 pages.

(Continued)

*Primary Examiner* — Mohammad Ali
*Assistant Examiner* — Kelvin Booker
(74) *Attorney, Agent, or Firm* — Cooper Legal Group, LLC

(57) ABSTRACT

An exemplary method includes, capturing, during a semiconductor fabrication process performed using a semiconductor processing device including a liquid distribution component configured to dispense a liquid flowing with an intact curtain profile, first images of a view of a chamber of the semiconductor processing device. The method includes determining curtain profile classifications of the first images. A curtain profile classification of the curtain profile classifications indicates a first value indicating that an image exhibits the liquid flowing with the intact curtain profile, or a second value indicating that the image does not exhibit the liquid flowing with the intact curtain profile. The method includes determining a plurality of groups of images based upon an order of the first images and the curtain profile classifications of the first images. The method includes determining, based upon the plurality of groups, whether the (Continued)

semiconductor fabrication process is associated with a potential processing error.

20 Claims, 18 Drawing Sheets

(51) Int. Cl.
*H10P 74/20* (2026.01)
*H10P 76/20* (2026.01)

(52) U.S. Cl.
CPC ............... *G06T 2207/10016* (2013.01); *G06T 2207/20081* (2013.01); *G06T 2207/30148* (2013.01)

(56) References Cited

U.S. PATENT DOCUMENTS

2008/0037013 A1* 2/2008 Yamamoto .......... G03F 7/70341 356/237.2
2014/0138801 A1* 5/2014 Tsai ........................ H10P 50/71 257/642
2014/0272704 A1* 9/2014 Chang ..................... G03F 7/168 156/345.23
2014/0328534 A1* 11/2014 Lin ....................... G06T 7/0006 382/149
2015/0170929 A1* 6/2015 Chiang ................. B01F 23/551 156/345.12
2017/0186778 A1* 6/2017 Miyake .................. H10K 85/60
2022/0299876 A1* 9/2022 Lee ......................... G03F 7/162

FOREIGN PATENT DOCUMENTS

CN 110967941 A * 4/2020 ................ G01P 5/20
JP 2009071124 A * 4/2009 ......... G03F 7/70341
TW 200305927 A * 11/2003 ......... G03F 7/70891
TW 200408328 A * 5/2004 ................ G01P 5/20
TW 201138110 A * 11/2011 ........... H10D 86/423

OTHER PUBLICATIONS

Liu, Yao-Hsien, et al., "Particle image velocimetry measurement of jet impingement in a cylindrical chamber with a heated rotating disk.", International Journal of Heat and Mass Transfer, 65 (2013), pp. 339-347.

* cited by examiner

SYSTEM AND METHOD FOR DETECTING SEMICONDUCTOR PROCESSING ERROR

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more components are used in semiconductor fabrication to form semiconductor devices on, in, and/or from a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
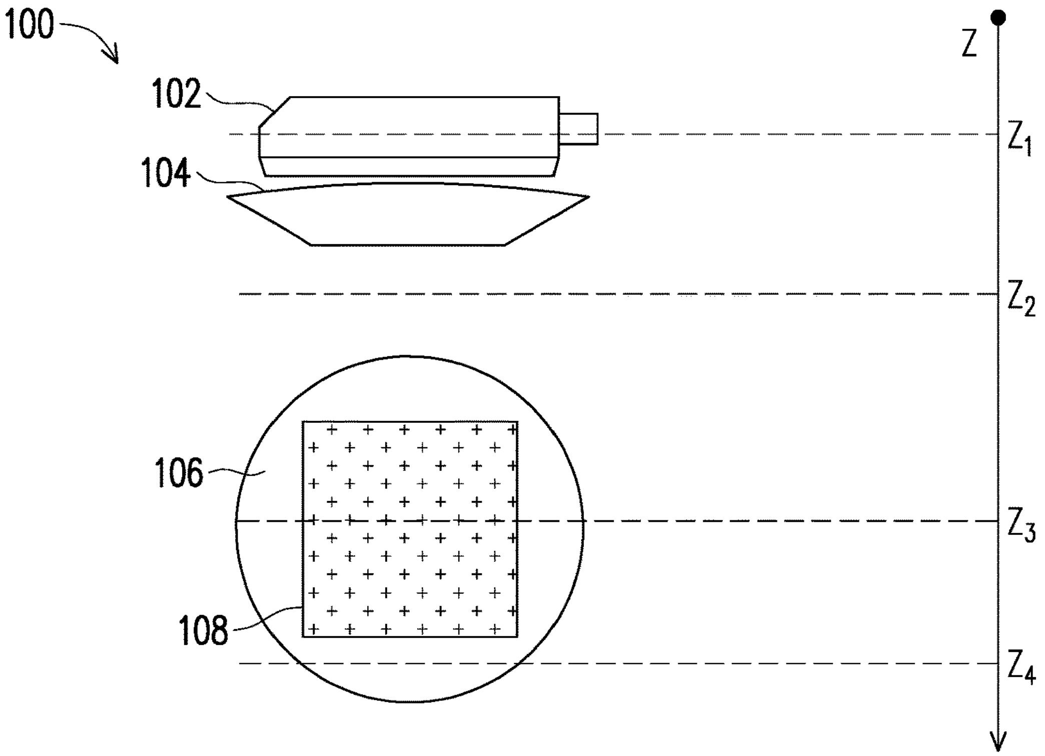
FIG. 1A illustrates a top view of a semiconductor processing device at a stage of a semiconductor fabrication process, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as “beneath,” “below,” “lower,” “above,” “upper” and the like, may be used herein for ease of description to describe one element or feature’s relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, images of a semiconductor fabrication process are captured using an image sensor. The semiconductor fabrication process is performed using a semiconductor processing device including a liquid distribution component configured to dispense a liquid flowing with an intact curtain profile. The images have a view of the liquid flowing from the liquid distribution component. In accordance with some embodiments, a trained machine learning model is used to determine curtain profile classifications of the images. A curtain profile classification determined using the trained machine learning model indicates a first value indicating that an image exhibits the liquid flowing with the intact curtain profile, or a second value indicating that the image does not exhibit the liquid flowing with the intact curtain profile. In some embodiments, the first images are grouped into a plurality of groups of images based upon an order of the first images and the curtain profile classifications of the first images. In some embodiments, whether the semiconductor fabrication process is associated with a potential processing error is determined based upon the plurality of groups. In some embodiments, each group of the plurality of groups comprises contiguous images associated with curtain profile classifications that indicate the first value. In some embodiments, whether the semiconductor fabrication process is associated with the potential processing error is determined based upon at least one of a quantity of groups of the plurality of groups, a predicted quantity of groups of the plurality of groups, or other information determined based upon the plurality of groups. Accordingly, the potential processing error is automatically detected without relying upon a technician to manually inspect semiconductor fabrication components in a facility to identify the potential processing error, which can be dangerous, difficult, or even impossible for the technician to identify.

In some embodiments, determining the plurality of groups and using the plurality of groups to determine whether the semiconductor fabrication process is associated with the potential processing error provides for increased accuracy of the determination of whether the semiconductor fabrication process is associated with the potential processing error, as compared to some systems that analyze each image individually, such as by comparing a curtain profile classification of each image with a corresponding expected curtain profile classification associated with the image. In some embodiments, such systems trigger an alarm in response to determining that a curtain profile classification of a single image does not match an expected curtain profile classification of the single image, such as where the curtain profile classification of the single image indicates the second value, and the expected curtain profile classification of the single image is the first value. However, in some embodiments, the curtain profile classification of the single image does not match the expected curtain profile classification of the single image due to a reason different than the potential processing error, such as at least one of a timing difference between one or more timing parameters used to calculate the expected curtain profile classification of the single image and a timing of the semiconductor fabrication process, a signal transmission delay between the image sensor and an error detection system, or other reason. In some embodiments, the timing difference is due, at least in part, to at least one of one or more changes to the semiconductor processing device, one or more changes to an environment of the semiconductor processing device, or one or more other factors. However, in accordance with at least some of the embodiments of the present disclosure, even when the curtain profile classification of the single image does not match the expected curtain profile classification, if other images neighboring the single image are correctly classified as the expected curtain profile classification, a corresponding group of images with the expected curtain profile classification are identified and the curtain profile classification of the single image is not used as a basis to trigger the alarm, thereby avoiding incorrectly using the single image as the basis to trigger the alarm, thus providing for at least one of a reduced false positive rate, an increased success ratio, etc. associated with detecting potential processing errors.

In some embodiments, in response to determining that the semiconductor fabrication process is associated with the potential processing error, one or more corrective actions are performed. In some embodiments, one or more wafers processed in the semiconductor fabrication process are at least one of checked for defects, repaired, scrapped, etc. due to the potential processing error. In some embodiments, repairing a wafer with wafer defects prior to a subsequent fabrication process protects the wafer from damage that would occur if the wafer underwent the subsequent fabrication process without being repaired. In some embodiments, in response to determining that the semiconductor fabrication process is associated with the potential processing error, one or more signals instructing the semiconductor processing device to cease operation or switch an operational mode are transmitted to the semiconductor processing device. Ceasing the operation of the semiconductor processing device or switching the operational mode of the semiconductor processing device can inhibit the semiconductor processing device from causing damage to at least one of a wafer being treated, the semiconductor processing device, or surrounding equipment. In some embodiments, in response to determining that a semiconductor fabrication process is associated with a potential processing error, one or more maintenance events are scheduled to repair the semiconductor processing device.

FIGS. 1A-1F illustrates top views of a semiconductor processing device 100 at various stages of a semiconductor fabrication process performed using the semiconductor processing device 100, in accordance with some embodiments. The semiconductor processing device 100 comprises at least one of a liquid distribution component 102, a shutter 104, a wafer support 106 configured to support a wafer 108, or other components. For ease of illustration, structures, features, elements, etc. other than the liquid distribution component 102, the shutter 104, the wafer support 106, and/or the wafer 108 are removed in FIGS. 1A-1F to show positions of the liquid distribution component 102, the shutter 104, the wafer support 106, and/or the wafer 108 relative to each other.

In some embodiments, at least one of the wafer support 106 or the wafer 108 is disposed in a chamber (shown in FIGS. 3A-3B) of the semiconductor processing device 100. In some embodiments, the chamber is a processing chamber in which one or more wafers are treated via semiconductor fabrication processes performed by the semiconductor processing device 100. In some embodiments, the wafer 108 comprises at least one of a substrate, one or more layers, one or more doped regions, or other structure. In some embodiments, the chamber is discontinuous or has a break so as to surround, encircle, etc. some but not all of the wafer 108 and/or one or more other components in the chamber. In some embodiments, one or more sides of the chamber have one or more openings that expose an interior of the chamber to outside the chamber.

In some embodiments, the liquid distribution component 102 is configured to dispense a processing liquid onto the wafer 108 to treat the wafer 108 during the semiconductor fabrication process. In some embodiments, the liquid distribution component 102 comprises at least one of (i) a puddle, (ii) a showerhead, (iii) a structure with one or more fluid paths which conduct the processing liquid from a liquid source (not shown) to one or more outlets (not shown), wherein the processing liquid exits the one or more outlets to be dispensed onto the wafer 108, or (iv) other type of structure. In some embodiments, a composition of the processing liquid depends upon a type of process of the semiconductor fabrication process.

In some embodiments, the semiconductor fabrication process comprises a photomask development process performed to develop a photomask (not shown) on the wafer 108 using the processing liquid. In some embodiments, the processing liquid comprises a developer liquid, such as developer solution. In some embodiments, the developer liquid at least one of dissolves or washes away one or more regions of a photoresist (not shown) on the wafer 108 to form the photomask from the photoresist. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of the developer liquid to the negative photoresist during the photomask development process removes non-illuminated regions of the negative photoresist. A pattern formed in the negative photoresist is thus a negative of a pattern defined by opaque regions of a template, such as a mask, between the light source and the negative photoresist. In a positive photoresist, illuminated regions of the positive photoresist become soluble and are removed via application of the developer liquid during the photomask development process. Thus, a pattern formed in the positive photoresist is a positive image of opaque regions of the template, such as a mask, between the light source and the positive photoresist.

In some embodiments, the semiconductor fabrication process comprises rinsing the wafer 108 using the processing liquid, and the processing liquid comprises a rinsing liquid. In some embodiments, the rinsing liquid comprises at least one of de-ionized water or other suitable liquid.

In some embodiments, the semiconductor fabrication process comprises coating the wafer 108 using the processing liquid, and the processing liquid comprises coating liquid. In some embodiments, the coating liquid is coated onto a surface of the wafer 108 during the semiconductor fabrication process.

In some embodiments, the composition of the processing liquid dispensed by the liquid distribution component 102 changes throughout the semiconductor fabrication process. In some embodiments, the processing liquid dispensed by the liquid distribution component 102 comprises the developer liquid in a first part of the semiconductor fabrication process for developing the photomask and comprises the rinsing liquid in a second part of the semiconductor fabrication process for rinsing the wafer 108. In some embodiments, rinsing the wafer 108 in the second part of the semiconductor fabrication process removes residue from at least one of the developer liquid or the photoresist.

Other types of semiconductor fabrication processes are within the scope of the present disclosure. Other examples of the processing liquid dispensed by the liquid distribution component 102 during the semiconductor fabrication process are within the scope of the present disclosure.

In some embodiments, during the semiconductor fabrication process, the liquid distribution component 102 moves between various z-axis positions on a z-axis shown in FIGS. 1A-1F. FIG. 1A illustrates the semiconductor processing device 100 at a first time when the liquid distribution component 102 is at z-axis position $z_1$ on the z-axis, according to some embodiments. In some embodiments, the liquid distribution component 102 is in a housing structure (not shown) of the semiconductor processing device 100 when the liquid distribution component 102 is at z-axis position $z_1$. In some embodiments, the shutter 104 is fitted to an entryway to an interior of the housing structure. In some embodiments, the shutter 104 provides ingress and egress to the interior of the housing structure to access the liquid distribution component 102. In some embodiments, the shutter 104 is moved from a first position blocking the entryway to a second position (not shown) to expose the entryway. In some embodiments, when the shutter 104 is at the second position, the liquid distribution component 102 can exit the housing structure to move from z-axis position $z_1$ to z-axis position $z_2$. In some embodiments, the liquid distribution component 102 exits the housing structure and moves to z-axis position $z_2$ in response to initiating the semiconductor fabrication process. In some embodiments, the liquid distribution component 102 is housed in the housing structure between semiconductor fabrication processes performed by the liquid distribution component 102.

Figure 1B:
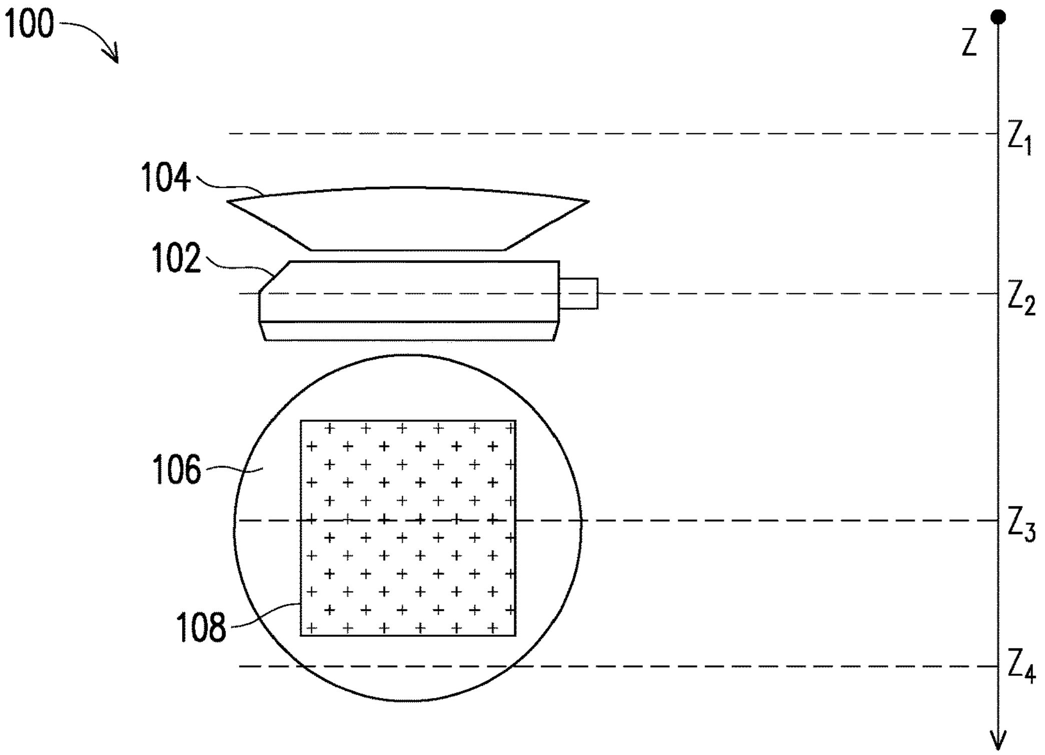
FIG. 1B illustrates a top view of a semiconductor processing device at a stage of a semiconductor fabrication process, in accordance with some embodiments.
Figure 1C:
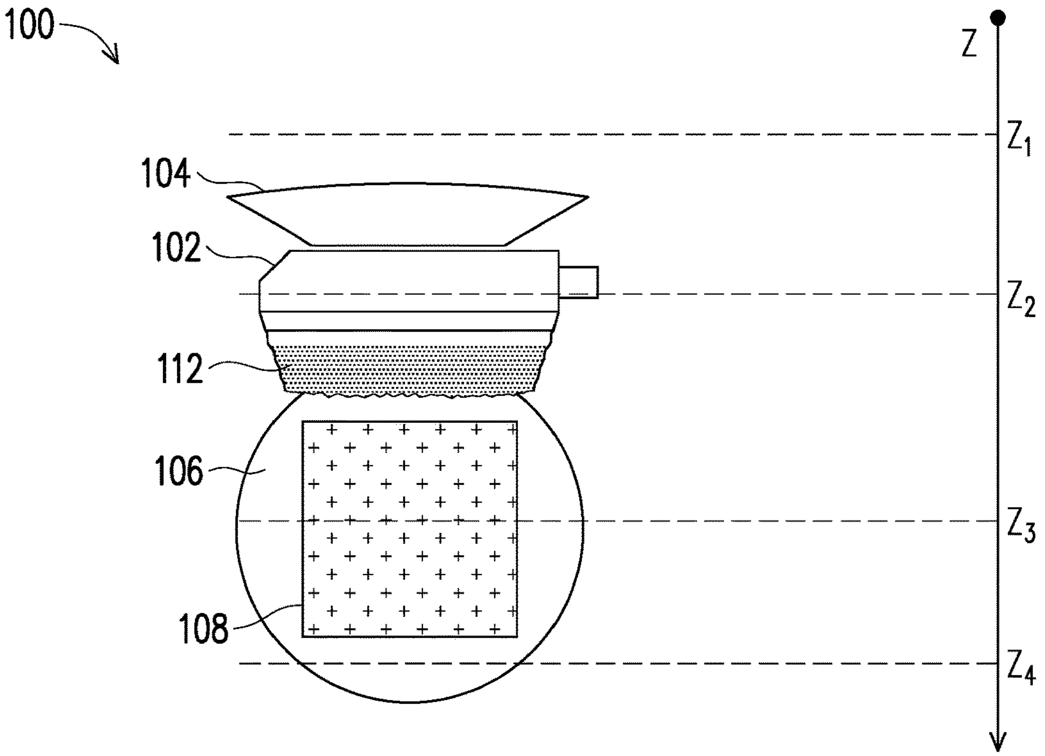
FIG. 1C illustrates a top view of a semiconductor processing device at a stage of a semiconductor fabrication process, in accordance with some embodiments.

FIG. 1B illustrates the semiconductor processing device 100 at a second time when the liquid distribution component 102 is at z-axis position $z_2$ on the z-axis, according to some embodiments. In some embodiments, z-axis position $z_2$ corresponds to a base position of the liquid distribution component 102. FIG. 1C illustrates the liquid distribution component 102 at a third time when the liquid distribution component 102 is at z-axis position $z_2$ and is dispensing the processing liquid (shown with reference number 112). In some embodiments, the liquid distribution component 102 starts dispensing the processing liquid 112 in a flow activation event. In some embodiments, the liquid distribution component 102 is configured to dispense the processing liquid 112 to flow with an intact curtain profile.

Figure 1D:
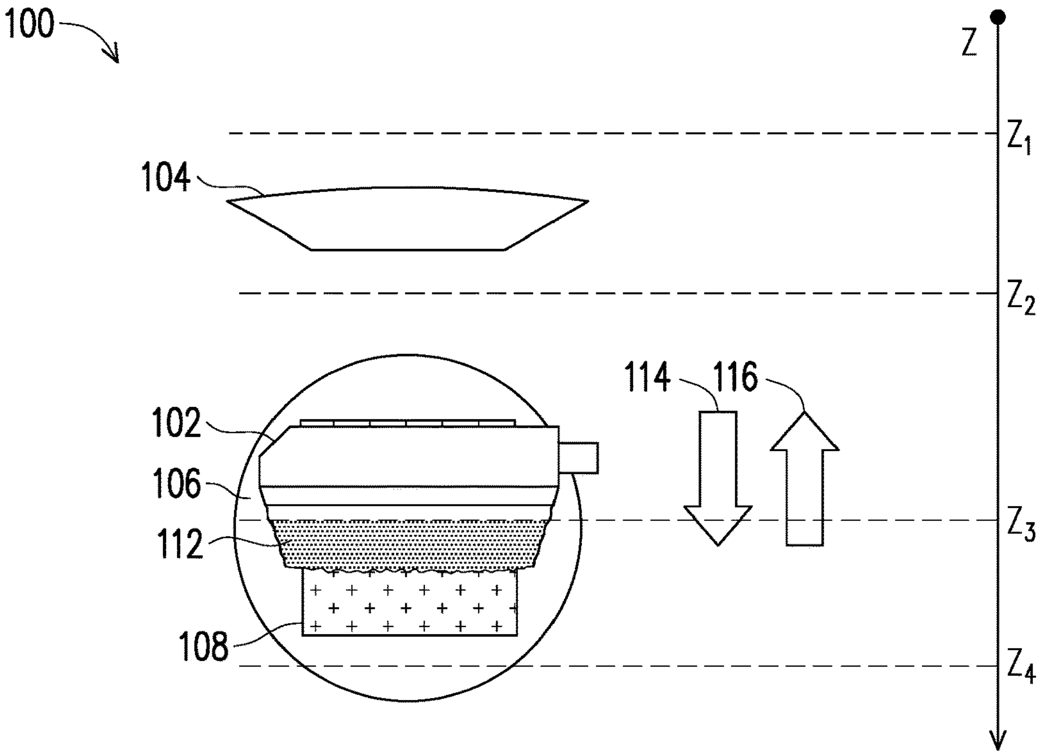
FIG. 1D illustrates a top view of a semiconductor processing device at a stage of a semiconductor fabrication process, in accordance with some embodiments.

In some embodiments, after the flow activation event, the liquid distribution component 102 is moved in one or more movement stages of the semiconductor fabrication process. FIG. 1D illustrates the semiconductor processing device 100 at a fourth time during a movement stage according to some embodiments. In some embodiments, in a first movement stage, the liquid distribution component 102 moves in a first direction 114 from z-axis position $z_2$ to z-axis position $z_4$. In some embodiments, in the first movement stage, the liquid distribution component 102 moves along a first path overlying the wafer 108. In some embodiments, an entirety of the wafer 108 is between z-axis position $z_2$ and z-axis position $z_4$. In accordance with some embodiments, during the first movement stage, the liquid distribution component 102 distributes the processing liquid 112 to various parts of the wafer 108 as the liquid distribution component 102 moves from z-axis position $z_2$ to z-axis position $z_4$. In some embodiments, the liquid distribution component 102 dispensing the processing liquid 112 to flow with the intact curtain profile distributes the processing liquid 112 across the surface of the wafer 108 with increased uniformity as compared to the processing liquid 112 flowing without the intact curtain profile. In some embodiments, the increased uniformity provides for at least one of improved performance of the semiconductor fabrication process, more accurate fabrication of the wafer 108, or reduced wafer defects associated with uneven application of the processing liquid 112.

In some embodiments, in a second movement stage, the liquid distribution component 102 moves in a second direction 116 from z-axis position $z_4$ to z-axis position $z_2$. In some embodiments, in the second movement stage, the liquid distribution component 102 moves along a second path overlying the wafer 108. The second path fully overlaps with the first path. Embodiments are contemplated in which the first path does not fully overlap with the second path. In accordance with some embodiments, during the second movement stage, the liquid distribution component 102 distributes the processing liquid 112 to various parts of the wafer 108 as the liquid distribution component 102 moves from z-axis position $z_4$ to z-axis position $z_2$. In some embodiments, the fourth time associated with FIG. 1D corresponds to a time during the first movement stage or the second movement stage when the liquid distribution component 102 reaches z-axis position $z_3$. In some embodiments, z-axis position $z_3$ corresponds to a center of the wafer 108. In some embodiments, the second movement stage is performed in response to completion of the first movement stage when the liquid distribution component 102 reaches z-axis position $z_4$.

Figure 1E:
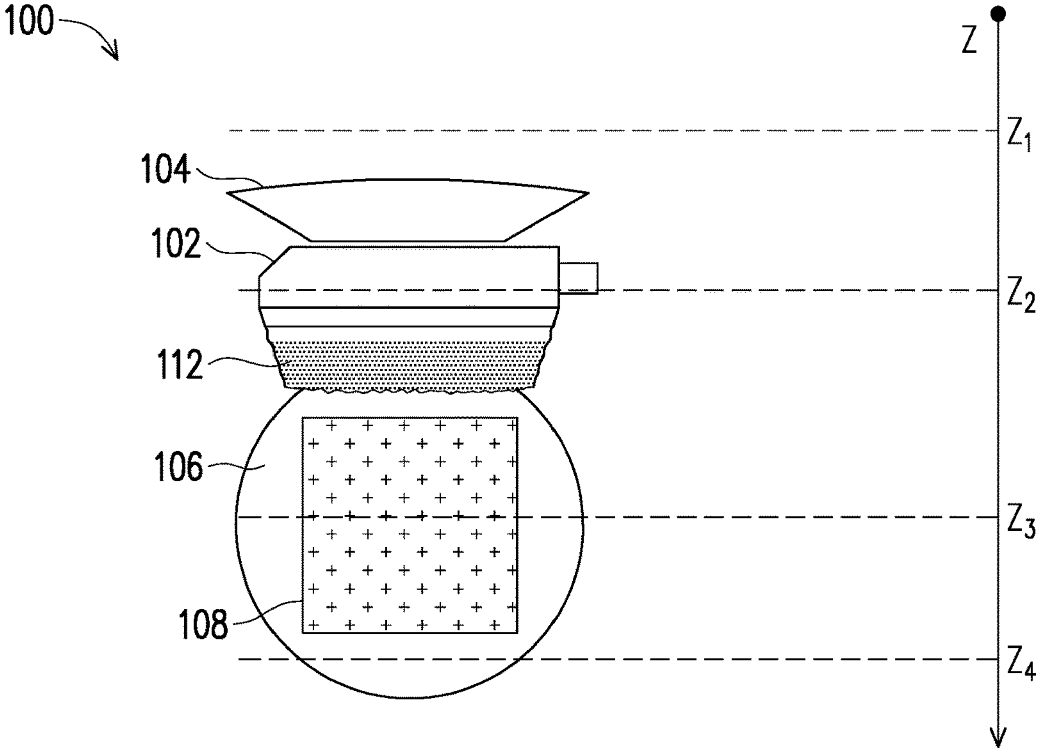
FIG. 1E illustrates a top view of a semiconductor processing device at a stage of a semiconductor fabrication process, in accordance with some embodiments.
Figure 1F:
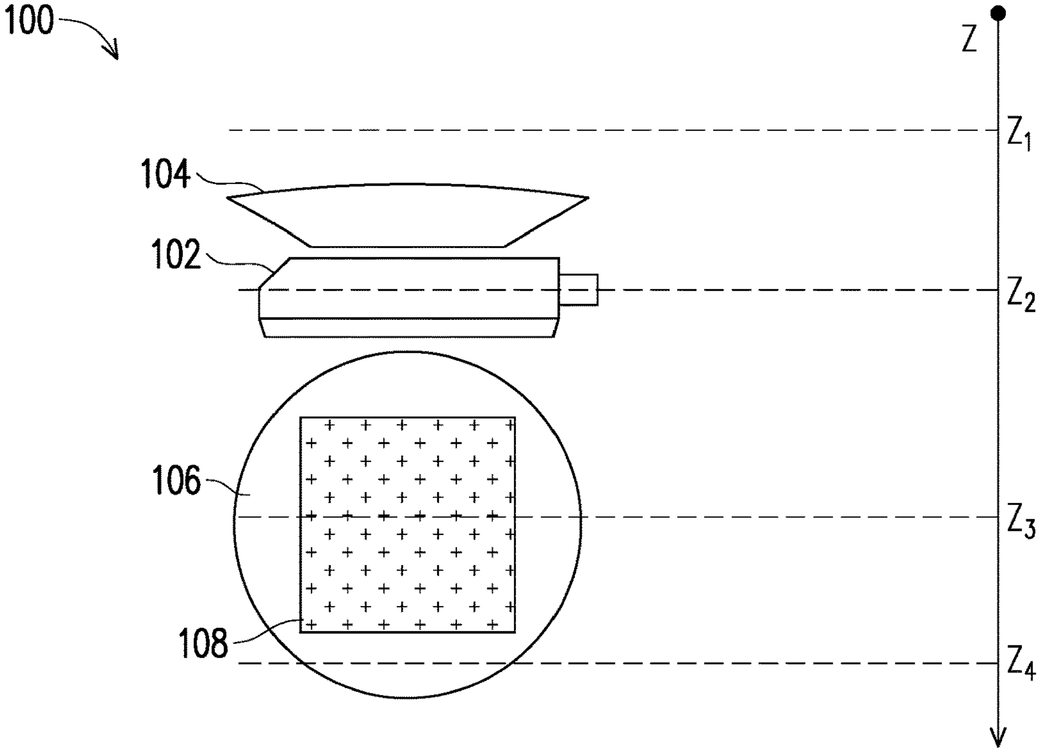
FIG. 1F illustrates a top view of a semiconductor processing device at a stage of a semiconductor fabrication process, in accordance with some embodiments.

FIG. 1E illustrates the semiconductor processing device 100 at a fifth time when the liquid distribution component 102 is at z-axis position $z_2$ after completion of the second movement stage, according to some embodiments. In some embodiments, the liquid distribution component 102 ceases dispensing the processing liquid 112 in a flow deactivation event. FIG. 1F illustrates the semiconductor processing device 100 at a sixth time after the flow deactivation event. In some embodiments, the liquid distribution component 102 ceases dispensing the processing liquid 112 in response to completing the second movement stage. In some embodiments, the liquid distribution component 102 continuously dispenses the processing liquid 112 between the flow activation event before the third time associated with FIG. 1C and the flow deactivation event after the fifth time associated with FIG. 1E.

In some embodiments, during the semiconductor fabrication process performed using the semiconductor processing device 100, an error detection system captures a first plurality of images of a view of the chamber of the semiconductor processing device 100. In some embodiments, the view of the first plurality of images corresponds to an interior view of the chamber. In some embodiments, the view includes at least some of the liquid distribution component 102, at least some of the wafer 108, or one or more other components of the semiconductor processing device 100. In some embodiments, the first plurality of images are captured using an image sensor, such as a camera. In some embodiments, the image sensor has a constant position relative to the semiconductor processing device 100 so as to have a fixed view throughout the first plurality of images captured during the semiconductor fabrication process. In some embodiments, the image sensor is attached to a component of the semiconductor processing device 100. In some embodiments, the view of the first plurality of images includes at least some of the liquid distribution component 102 when the liquid distribution component 102 is at one or more z-axis positions comprising at least one of z-axis position $z_2$ or one or more other positions around z-axis position $z_2$, such as shown in FIGS. 2B, 20, 2E and 2F. In some embodiments, the view of the first plurality of images includes at least some of a stream of the processing liquid 112 dispensed by the liquid distribution component 102 at one or more z-axis positions comprising at least one of z-axis position $z_2$ or one or more other positions around z-axis position $z_2$, such as shown in FIGS. 2B, 2C, 2E and 2F. In some embodiments, the view of the first plurality of images does not include at least some of an interior of the chamber and/or at least some of the wafer 108. In some embodiments, at least some of the first plurality of images are cropped to exclude at least some of the interior of the chamber and/or at least some of the wafer 108. Embodiments are contemplated in which the image sensor is moved throughout the semiconductor fabrication process to provide different views in different images of the first plurality of images.

Figure 2A:
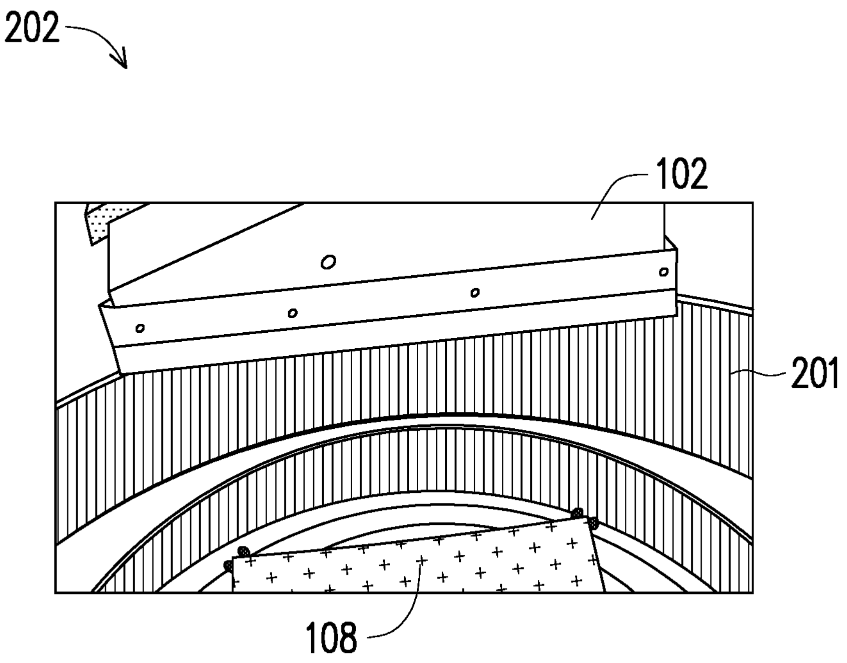
FIG. 2A illustrates an image captured using an image sensor, in accordance with some embodiments.

FIGS. 2A-2E illustrate at least some of the first plurality of images, according to some embodiments. FIG. 2A illustrates a first image 202 of the first plurality of images, according to some embodiments. In some embodiments, the first image 202 is captured during movement of the liquid distribution component 102 from z-axis position $z_1$ on the z-axis (shown in FIG. 1A) to z-axis position $z_2$. In some embodiments, the first image 202 is captured at the first time associated with FIG. 1A or at a time between the first time and the second time associated with FIG. 1B. In some embodiments, the first image 202 includes a portion of the liquid distribution component 102, a portion of the wafer 108, or a chamber wall 201 of the chamber.

Figure 2B:
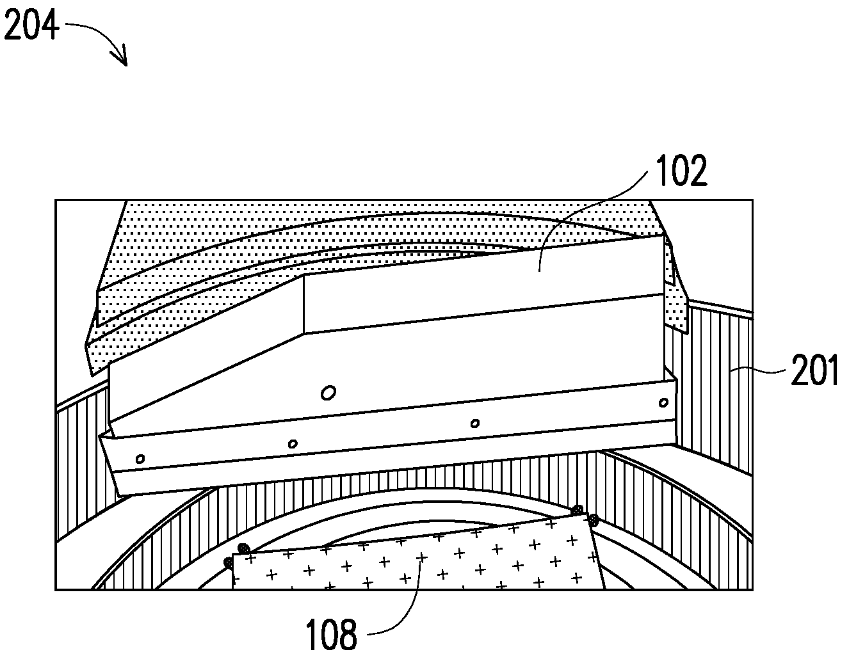
FIG. 2B illustrates an image captured using an image sensor, in accordance with some embodiments.

FIG. 2B illustrates a second image 204 of the first plurality of images, according to some embodiments. In some embodiments, the second image 204 is captured when the liquid distribution component 102 is at z-axis position $z_2$. In some embodiments, the second image 204 is captured at the second time associated with FIG. 1B.

Figure 2C:
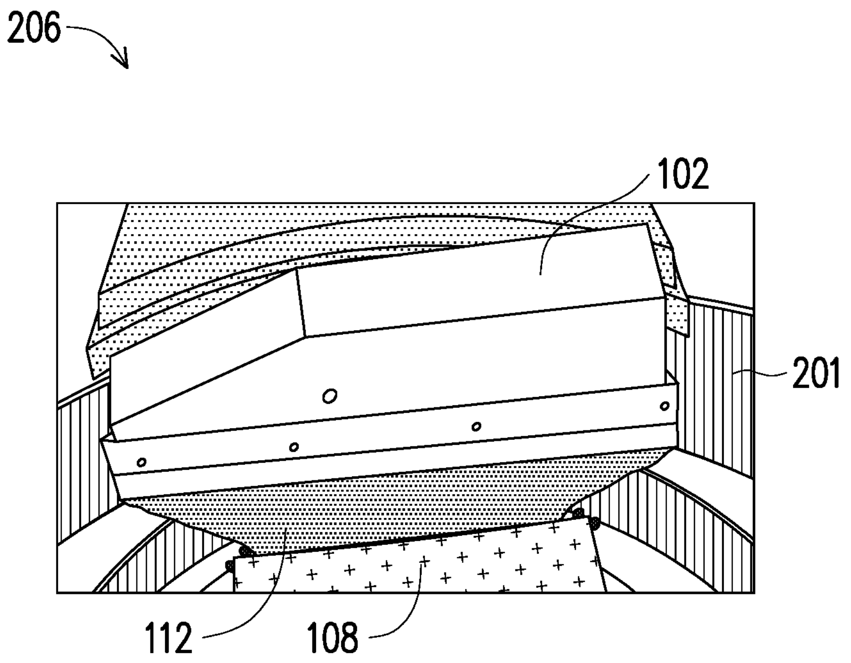
FIG. 2C illustrates an image captured using an image sensor, in accordance with some embodiments.

FIG. 2C illustrates a third image 206 of the first plurality of images, according to some embodiments. In some embodiments, the third image 206 is captured when the liquid distribution component 102 is at z-axis position $z_2$ and is dispensing the processing liquid 112. In some embodiments, the third image 206 is captured at the third time associated with FIG. 1C. In some embodiments, the first image 202 includes at least some of the processing liquid 112 flowing from the liquid distribution component 102 to the wafer 108.

Figure 2D:
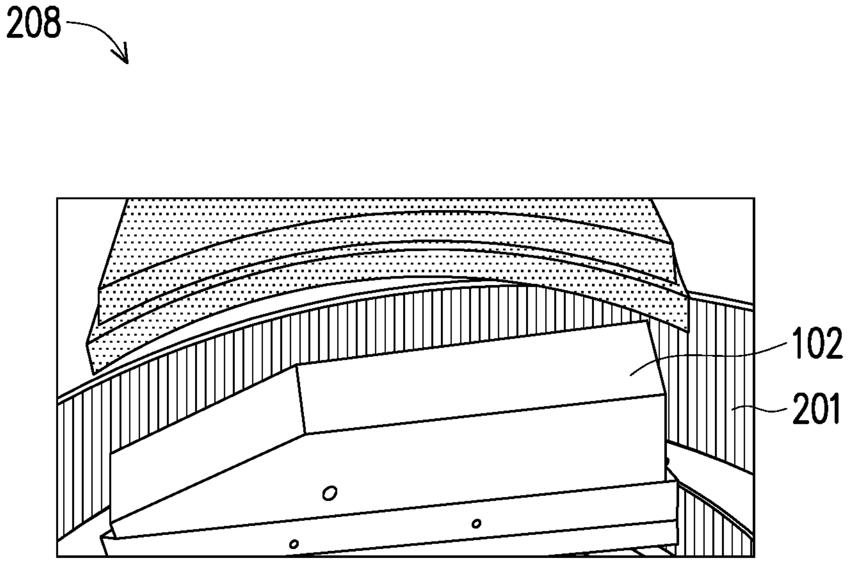
FIG. 2D illustrates an image captured using an image sensor, in accordance with some embodiments.

FIG. 2D illustrates a fourth image 208 of the first plurality of images, according to some embodiments. In some embodiments, the fourth image 208 is captured when the liquid distribution component 102 is at z-axis position $z_3$ and is dispensing the processing liquid 112. In some embodiments, the fourth image 208 is captured at the fourth time associated with FIG. 1D. In some embodiments, the processing liquid 112 is not apparent in the fourth image 208.

Figure 2E:
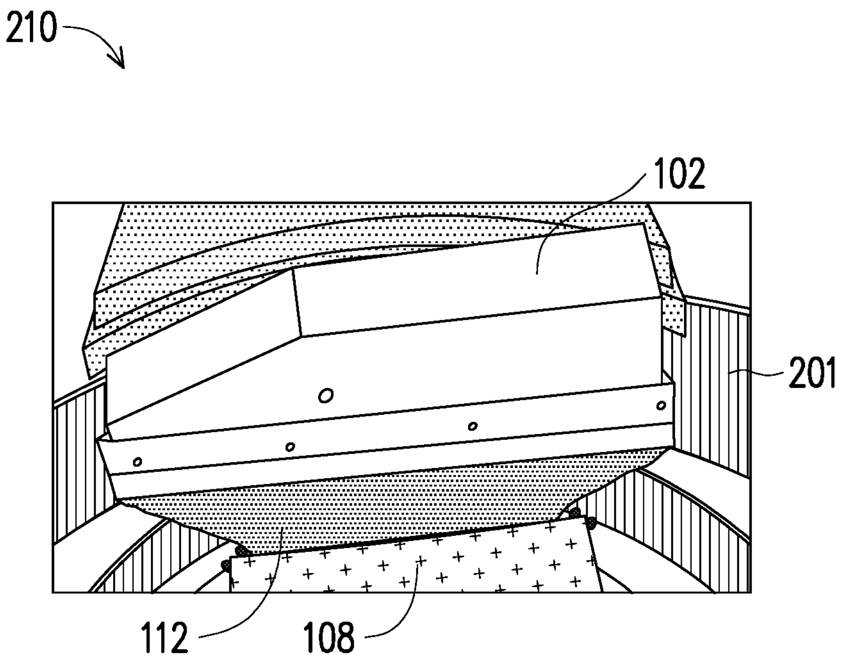
FIG. 2E illustrates an image captured using an image sensor, in accordance with some embodiments.

FIG. 2E illustrates a fifth image 210 of the first plurality of images, according to some embodiments. In some embodiments, the fifth image 210 is captured when the liquid distribution component 102 is at z-axis position $z_2$ and is dispensing the processing liquid 112. In some embodiments, the fifth image 210 is captured at the fifth time associated with FIG. 1E.

Figure 2F:
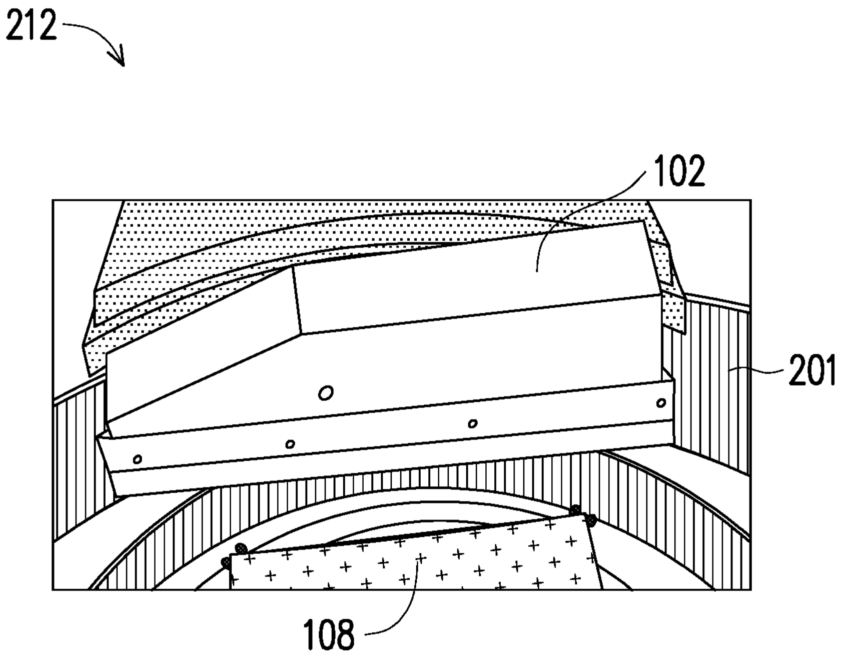
FIG. 2F illustrates an image captured using an image sensor, in accordance with some embodiments.

FIG. 2F illustrates a sixth image 212 of the first plurality of images, according to some embodiments. In some embodiments, the sixth image 212 is captured when the liquid distribution component 102 is at z-axis position $z_2$ and is not dispensing the processing liquid 112. In some embodiments, the sixth image 212 is captured at the sixth time associated with FIG. 1F.

Figure 3A:
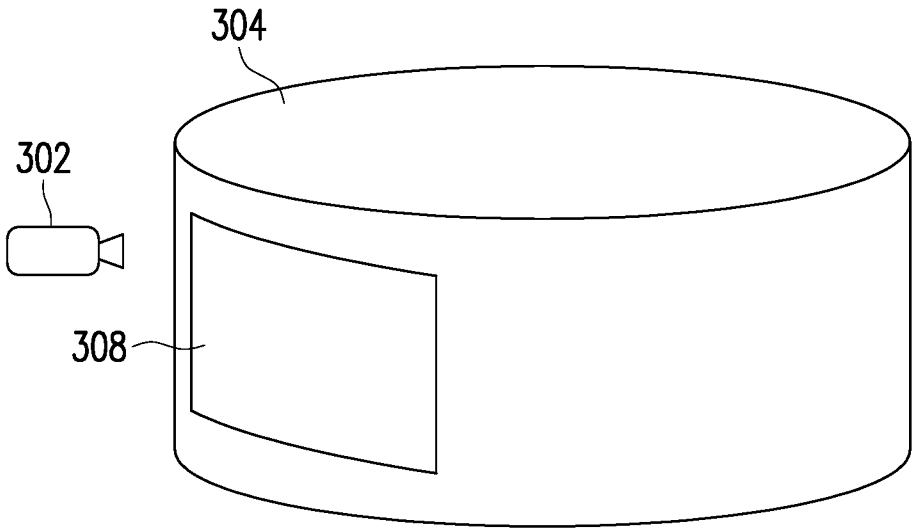
FIG. 3A illustrates a perspective view of a chamber and an image sensor, in accordance with some embodiments.
Figure 3B:
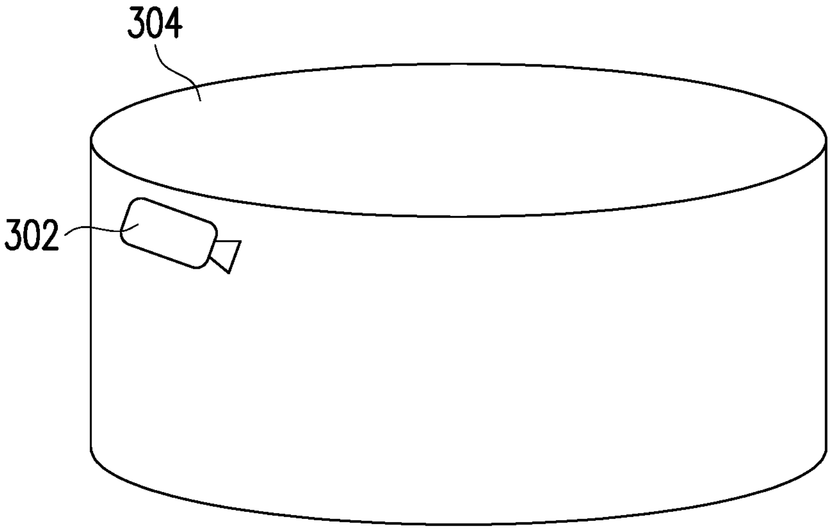
FIG. 3B illustrates a perspective view of a chamber and an image sensor, in accordance with some embodiments.

FIG. 3A illustrates a perspective view of the chamber (shown with reference number 304) of the semiconductor processing device 100 and the image sensor (shown with reference number 302) of the error detection system, according to some embodiments. The image sensor 302 comprises at least one of a charge coupled device (CCD) image sensor, a complementary metal oxide semiconductor (CMOS) image sensor, a contact image sensor (CIS), recording film, or other device. In some embodiments, the image sensor 302 is positioned outside the chamber 304, and utilizes a window 308 in an outer wall of the chamber 304 to capture images of the first plurality of images. In some embodiments, the window 308 is an opening, or is made of a material, such as a transparent material, through which image sensor 302 can capture images. FIG. 3B illustrates a perspective view of the image sensor 302 and the chamber 304, according to some embodiments in which the image sensor 302 is positioned inside the chamber 304.

In some embodiments, the error detection system uses the first plurality of images to determine whether the semiconductor fabrication process is associated with a potential processing error. In some embodiments, the potential processing error is associated with the processing liquid 112 flowing from the liquid distribution component 102 to the wafer 108 without the intact curtain profile. In some embodiments, the processing liquid 112 flowing from the liquid distribution component 102 to the wafer 108 without the intact curtain profile results in less uniform distribution of the processing liquid 112. In some embodiments, a first portion of the wafer 108 is processed, such as developed, coated, rinsed, etc. by the processing liquid 112 at a first rate, and a second portion of the wafer 108 is processed, such as developed, coated, rinsed, etc. by the processing liquid 112 at a second rate. In some embodiments, the processing liquid 112 flowing from the liquid distribution component 102 to the wafer 108 without the intact curtain profile results in more of the processing liquid 112 being applied to the first portion of the wafer 108 than the second portion of the wafer 108. In some embodiments, when more of the processing liquid 112 is applied to the first portion of the wafer 108 than the second portion of the wafer 108, the first rate associated with the first portion is higher than the second rate associated with the second portion of the wafer 108, resulting in at least one of uneven development, uneven coating, uneven rinsing, etc. between the first portion and the second portion.

In some embodiments, the error detection system captures the first plurality of images based upon a processing profile, such as a recipe, associated with the semiconductor fabrication process. In some embodiments, the error detection system captures the first plurality of images over a first time period based upon one or more timing parameters of the semiconductor fabrication process, such as at least one of a timing parameter corresponding to a start time of the semiconductor fabrication process, a timing parameter corresponding to a time of completion of the semiconductor fabrication process, a timing parameter corresponding to a start time of a stage of the semiconductor fabrication process, a timing parameter corresponding to a time of completion of the stage of the semiconductor fabrication process, or other timing parameter. In some embodiments, the first time period during which the error detection system captures the first plurality of images spans from the start time of the semiconductor fabrication process to the time of completion of the semiconductor fabrication process. In some embodiments, the first time period spans from the start time of the stage of the semiconductor fabrication process to the time of completion of the stage of the semiconductor fabrication process. In some embodiments, the first time period starts after, before, or at the same time as the start time of the semiconductor fabrication process. In some embodiments, the first time period ends before, after, or at the same time as the time of completion of the semiconductor fabrication process. In some embodiments, during the first time period, the image sensor 302 captures images of the first plurality of images at an image capture frequency. The image capture frequency is between about one image per second to about 20 images per second. Other values of the image capture frequency are within the scope of the present disclosure.

Other techniques for capturing the first plurality of images other than those explicitly provided herein are within the scope of the present disclosure.

Figure 4A:
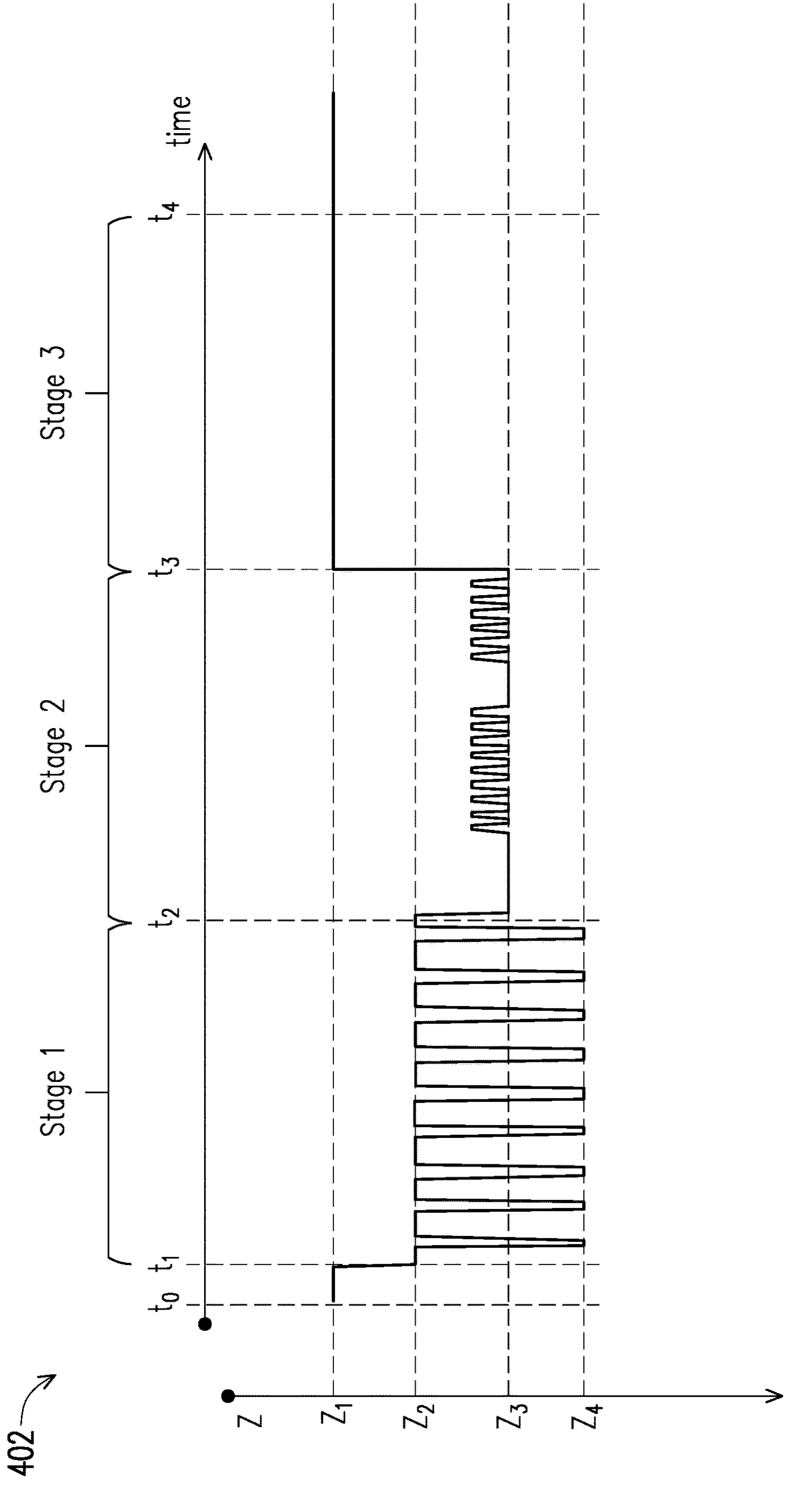
FIG. 4A illustrates a timing diagram associated with a semiconductor fabrication process, in accordance with some embodiments.
Figure 4B:
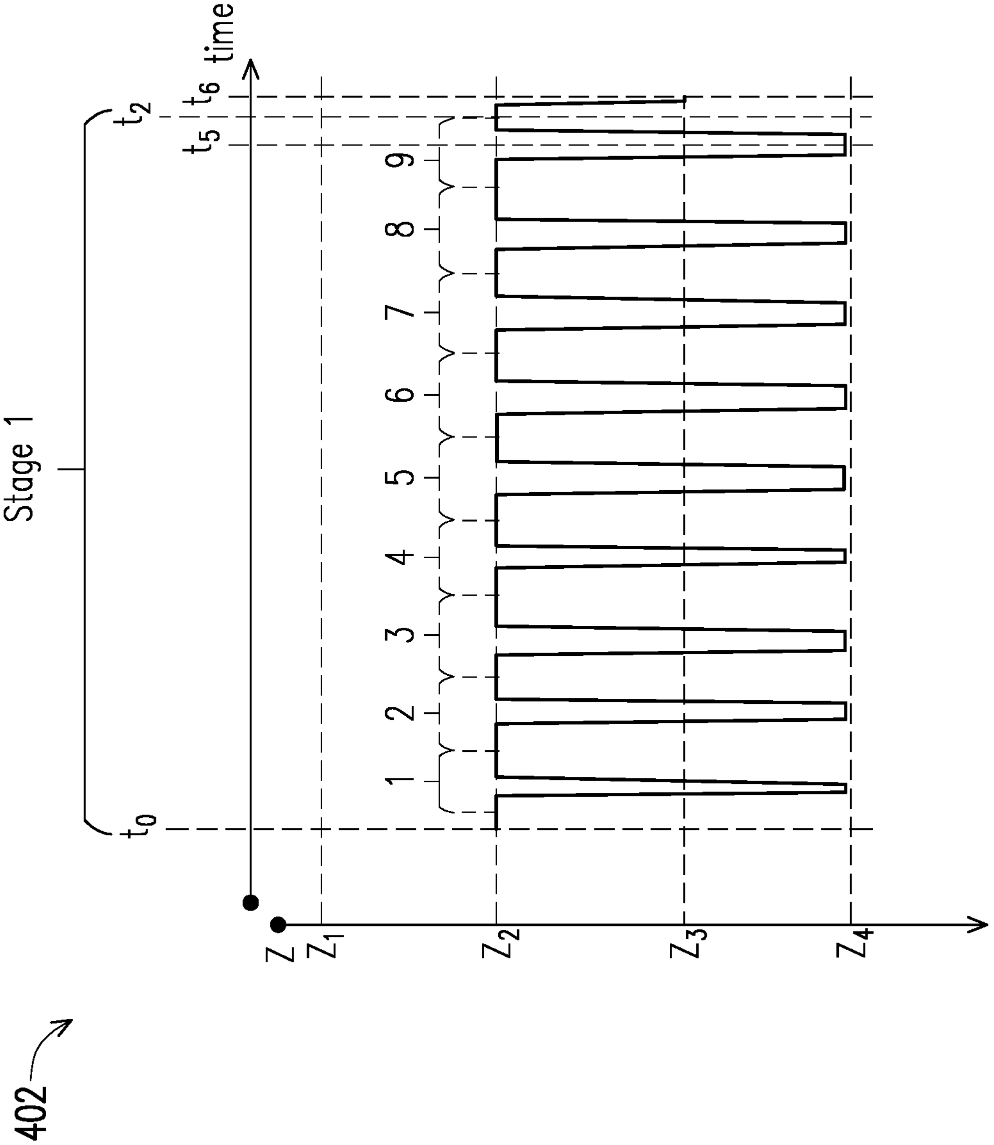
FIG. 4B illustrates a timing diagram associated with a semiconductor fabrication process, in accordance with some embodiments.
Figure 4C:
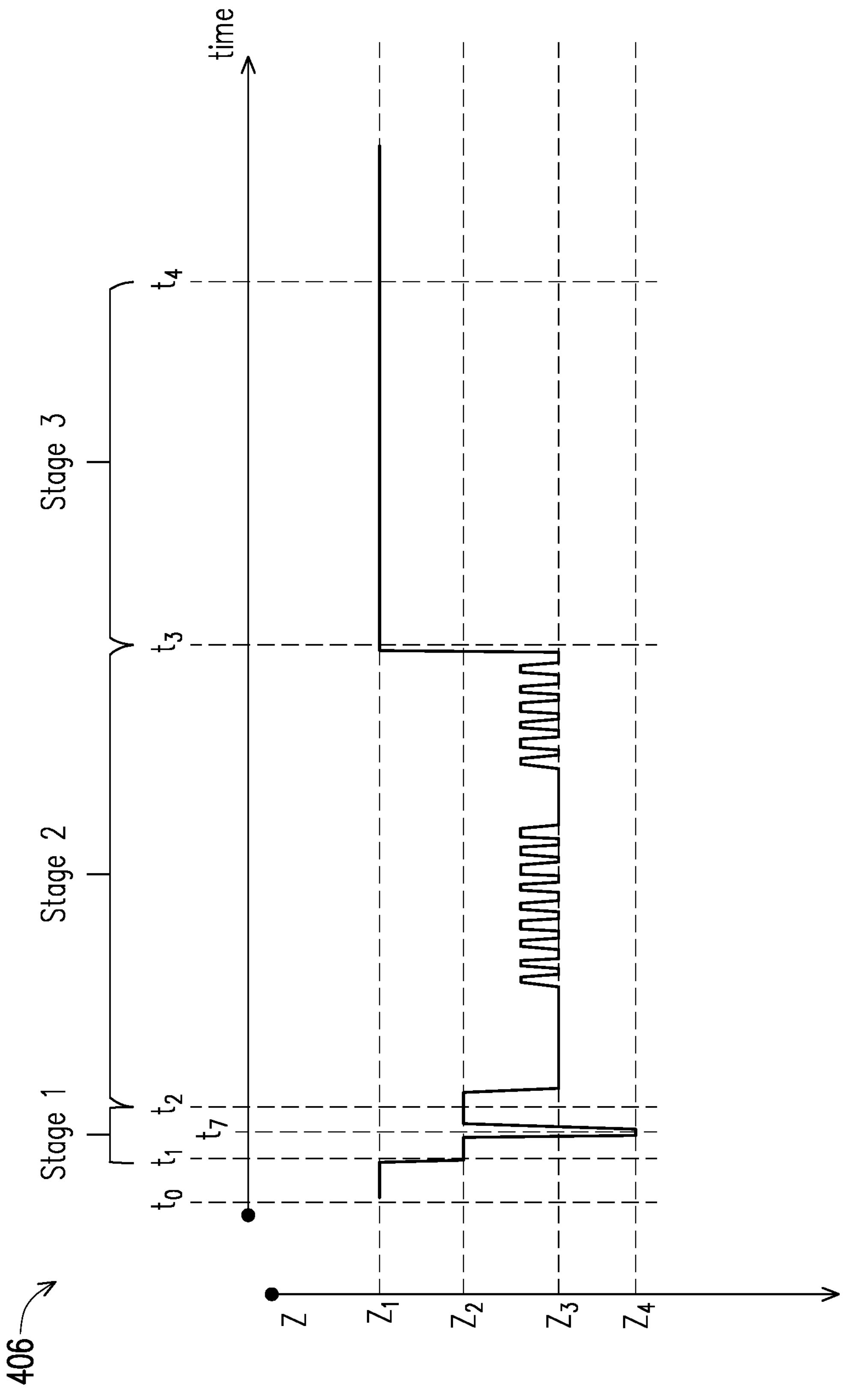
FIG. 4C illustrates a timing diagram associated with a semiconductor fabrication process, in accordance with some embodiments.

FIGS. 4A-4C illustrate timing diagrams associated with the semiconductor fabrication process, according to some embodiments. FIG. 4A illustrates a first timing diagram 402 associated with the semiconductor fabrication process, in accordance with some embodiments. The first timing diagram 402 shows a curve corresponding to a z-axis position of the liquid distribution component 102 (shown in FIG. 4A) along the z-axis relative to time. In some embodiments, the semiconductor fabrication process starts at time $t_0$ when the liquid distribution component 102 is at z-axis position $z_1$, such as at the first time shown in FIG. 1A. In some embodiments, the semiconductor fabrication process is completed at time $t_4$ when the liquid distribution component 102 is at z-axis position $z_1$. In some embodiments, the liquid distribution component 102 is in the housing structure of the semiconductor processing device 100 at time $t_4$.

In some embodiments, the semiconductor fabrication process comprises one or more stages. In some embodiments, the one or more stages comprise at least one of a first stage ("Stage 1" in FIG. 4A), a second stage ("Stage 2" in FIG. 4A), a third stage ("Stage 3" in FIG. 4A), or one or more other stages. In some embodiments, the first stage spans a time period $t_1$-$t_2$ (from time $t_1$ to time $t_2$), the second stage spans a time period $t_2$-$t_3$ (from time $t_2$ to time $t_3$), and the third stage spans a time period $t_3$-$t_4$ (from time $t_3$ to time $t_4$). According to some embodiments, the first stage is a development stage, the second stage is a rinsing stage, and the third stage is a drying stage. During the development stage, the processing liquid 112 dispensed by the liquid distribution component 102 onto the wafer 108 comprises the developer liquid to develop the photomask on the wafer 108. During the rinsing stage, the processing liquid 112 dispensed by the liquid distribution component 102 onto the wafer 108 comprises the rinsing liquid to rinse the wafer 108. During the drying stage, the wafer 108 is dried using a wafer drying process, such as at least one of a spin-drying process, an isopropyl alcohol (IPA) vapor drying process, or other drying process. In some embodiments, during the drying stage, the liquid distribution component 102 is at z-axis position $z_1$, such as in the housing structure of the semiconductor processing device 100. In some embodiments, at least one of the shutter 104 (shown in FIGS. 1A-1F) or one or more other components of the semiconductor processing device 100 separates the liquid distribution component 102 from the wafer drying process.

In some embodiments, during the first stage, the liquid distribution component 102 moves between z-axis position $z_2$ and z-axis position $z_3$ in one or more movement cycles. In some embodiments, in each movement cycle of the one or more movement cycles, the liquid distribution component 102 moves from z-axis position $z_2$ to z-axis position $z_3$ in the first movement stage, and moves back from z-axis position $z_3$ to z-axis position $z_2$ in the second movement stage. In the first timing diagram 402 shown in FIG. 4A, the one or more movement cycles performed in the first stage comprise a plurality of movement cycles. In a third timing diagram 406 shown in FIG. 4C, the one or more movement cycles performed in the first stage comprise merely a single movement cycle.

FIG. 4B illustrates a second timing diagram 404 associated with the semiconductor fabrication process, in accordance with some embodiments. Relative to the first timing diagram 402 of FIG. 4A, the second timing diagram 404 is enlarged to focus on and/or show features of an embodiment of the first stage of the semiconductor fabrication process without at least some aspects of other stages of the semiconductor fabrication process. In some embodiments, the first stage of the semiconductor fabrication process comprises a plurality of flow cycles. In the second timing diagram 404 of FIG. 4B, the plurality of flow cycles comprises flow cycles 1, 2, 3, 4, 5, 6, 7, 8, and 9. Although FIG. 4B shows nine flow cycles, the plurality of flow cycles can comprise any quantity of flow cycles. In some embodiments, each flow cycle of one, some and/or all of the plurality of flow cycles comprises (i) a flow activation event in which the liquid distribution component 102 starts dispensing the processing liquid 112, and (ii) a flow deactivation event in which the liquid distribution component 102 ceases dispensing the processing liquid 112. In some embodiments, in each flow cycle of one, some, and/or all of the plurality of flow cycles, the liquid distribution component 102 continuously dispenses the processing liquid 112 between the flow activation event and the flow deactivation event. In some embodiments, in each flow cycle of one, some and/or all of the plurality of flow cycles, a movement cycle in which the liquid distribution component 102 moves from z-axis position $z_2$ to z-axis position $z_4$ and back to z-axis position $z_2$ occurs between the flow activation event and the flow deactivation event. Thus, in accordance with some embodiments, in each flow cycle of one, some and/or all of the plurality of flow cycles: (i) the liquid distribution component 102 starts dispensing the processing liquid 112 in a flow activation event, (ii) while the liquid distribution component 102 dispenses the processing liquid 112 after the flow activation event, the liquid distribution component 102 undergoes a movement cycle in which the liquid distribution component 102 moves from z-axis position $z_2$ to z-axis position $z_4$ and back to z-axis position $z_2$, and (iii) after (or before) completion of the movement cycle, the liquid distribution component 102 ceases dispensing the processing liquid 112 in a flow deactivation event. In some embodiments, each flow cycle of one, some, and/or all of the plurality of flow cycles comprises at least some of the acts shown in and/or described with respect to FIGS. 1B-1F. In some embodiments, when the plurality of flow cycles includes nine flow cycles, at least some of the acts shown in and/or described with respect to FIGS. 1B-1F are repeated nine times in the nine flow cycles in the first stage of the semiconductor fabrication process.

In some embodiments, the first time period during which the error detection system captures the first plurality of images spans merely a portion of the semiconductor fabrication process. In some embodiments, the image sensor 302 captures images of the first plurality of images during the first stage and does not capture images at least one of during the second stage or during the third stage. In some embodiments, the image sensor 302 captures images during the first stage but not the second stage and/or not the third stage since one or more processing acts performed in the first stage are more sensitive to uneven distribution of the processing liquid 112 than processing acts in the second stage and/or the third stage. In some embodiments, uneven distribution of the developer liquid on the wafer 108 during the first stage can cause damage to the wafer 108, whereas, in some embodiments, uneven application of rinsing liquid on the wafer 108 in the second stage causes zero or a negligible amount of damage to the wafer 108 (and/or causes less damage to the wafer 108 than the developer liquid in the first stage).

In some embodiments, the image sensor 302 ceases capturing images of the first plurality of images in response to completion of at least one of the first stage, completion of a flow cycle of the first stage, completion of a movement cycle of the first stage, completion of a movement stage of the movement cycle, or other event. In some embodiments, the image sensor 302 ceases capturing images of the first plurality of images at time $t_5$ during flow cycle 9. In some embodiments, the image sensor 302 ceases capturing images of the first plurality of images at time $t_5$ in response to the liquid distribution component 102 moving from z-axis position $z_2$ to z-axis position $z_4$ in flow cycle 9. In some embodiments, the image sensor 302 ceases capturing images of the first plurality of images at time $t_6$ in response to the liquid distribution component 102 moving to z-axis position $z_4$ in response to completion of the first stage at time $t_2$.

FIG. 4C illustrates the third timing diagram 406 associated with the semiconductor fabrication process, in accordance with some embodiments. In some embodiments, the first stage of the semiconductor fabrication process comprises merely a single flow cycle with merely a single movement cycle. In some embodiments, the image sensor 302 ceases capturing images of the first plurality of images at time $t_7$ in response to the liquid distribution component 102 moving from z-axis position $z_2$ to z-axis position $z_4$ in the single flow cycle.

Other features, processes, configurations, etc. of the one or more stages of the semiconductor fabrication process other than those provided herein are within the scope of the present disclosure.

In some embodiments, the error detection system determines a first plurality of curtain profile classifications of the first plurality of images. In some embodiments, each curtain profile classification of one, some, and/or all of the first plurality of curtain profile classifications indicates a first value or a second value. In some embodiments, the first value indicates that an image exhibits the processing liquid 112 flowing with the intact curtain profile. In some embodiments, the second value indicates that the image does not exhibit the processing liquid 112 flowing with the intact curtain profile.

Figure 5A:
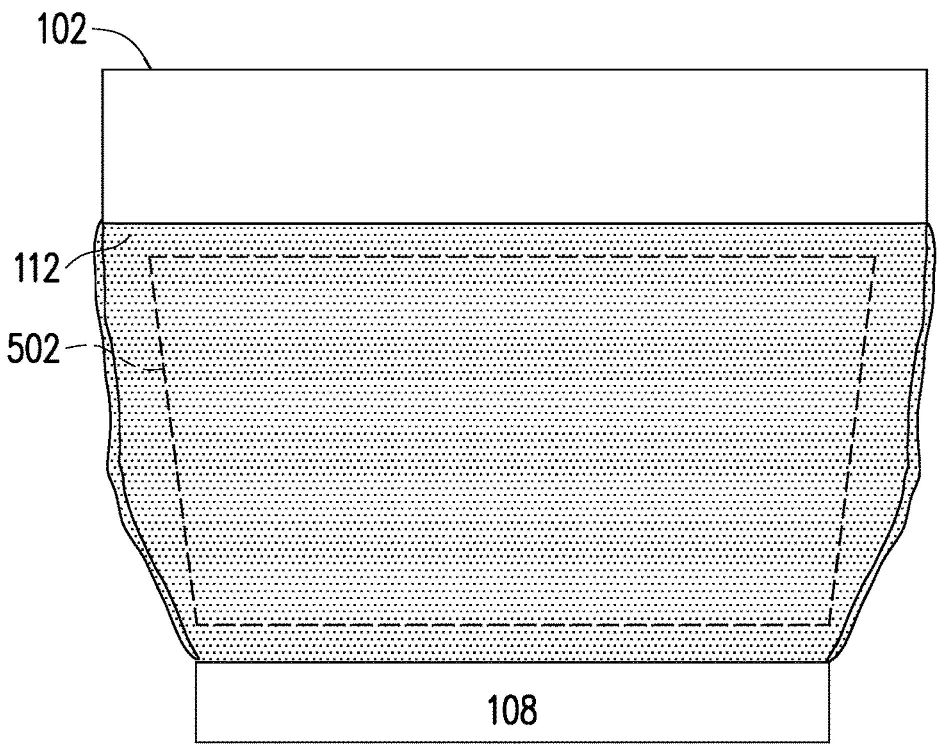
FIG. 5A illustrates a cross-sectional view of processing liquid flowing from a liquid distribution component to a wafer with an intact curtain profile, in accordance with some embodiments.
Figure 5B:
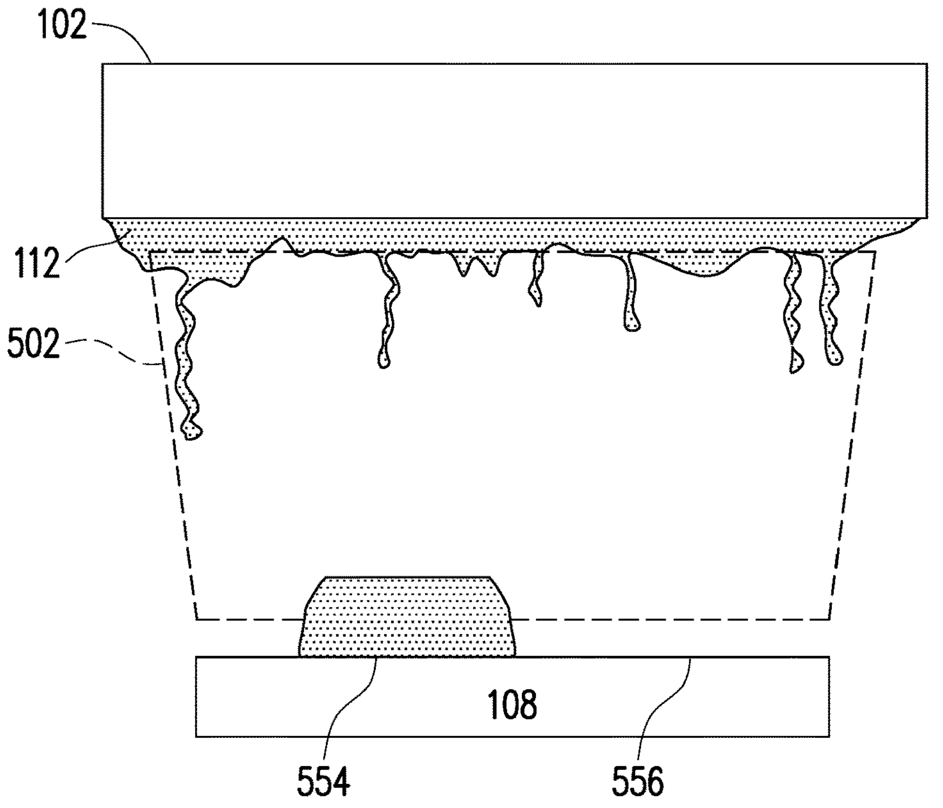
FIG. 5B illustrates a cross-sectional view of processing liquid flowing from a liquid distribution component to a wafer without an intact curtain profile, in accordance with some embodiments.

FIGS. 5A-5B illustrate cross-sectional views of the processing liquid 112 flowing from the liquid distribution component 102 to the wafer 108, according to some embodiments. FIG. 5A illustrates a representation the processing liquid 112 flowing from the liquid distribution component 102 to the wafer 108 with the intact curtain profile, according to some embodiments. In some embodiments, the processing liquid 112 is considered to flow with the intact curtain profile when the processing liquid 112 occupies at least a threshold proportion of a first region 502 between the liquid distribution component 102 and the wafer 108. In some embodiments, the threshold proportion corresponds to the entirety of the first region 502, and thus, the processing liquid 112 is considered to flow with the intact curtain profile when the processing liquid 112 occupies the entirety of the first region 502. In some embodiments, the threshold proportion corresponds between about 80% and about 95% of the first region 502. Other values of the threshold proportion are within the scope of the present disclosure. In some embodiments, the processing liquid 112 is considered to flow with the intact curtain profile when the processing liquid 112 has at least a threshold uniformity throughout the first region 502 between the liquid distribution component 102 and the wafer 108.

FIG. 5B illustrates a representation the processing liquid 112 flowing from the liquid distribution component 102 without the intact curtain profile, according to some embodiments. In some embodiments, the processing liquid 112 is not considered to flow with the intact curtain profile when the processing liquid 112 does not occupy at least the threshold proportion of the first region 502 between the liquid distribution component 102 and the wafer 108. In some embodiments, the processing liquid 112 flowing from the liquid distribution component 102 to the wafer 108 without the intact curtain profile results in more of the processing liquid 112 being applied to a portion 554 of the wafer 108 than a portion 556 of the wafer 108. In some embodiments, when more of the processing liquid 112 is applied to the portion 554 of the wafer 108 than the portion 556 of the wafer 108, a rate at which the portion 554 is treated is higher than a rate at which the portion 556 is treated, resulting in at least one of uneven development, uneven coating, uneven rinsing, etc. between the portion 554 and the portion 556.

Other examples, shapes, configurations, etc. of the intact curtain profile and/or of the curtain profile not being intact are within the scope of the present disclosure.

Figure 6:
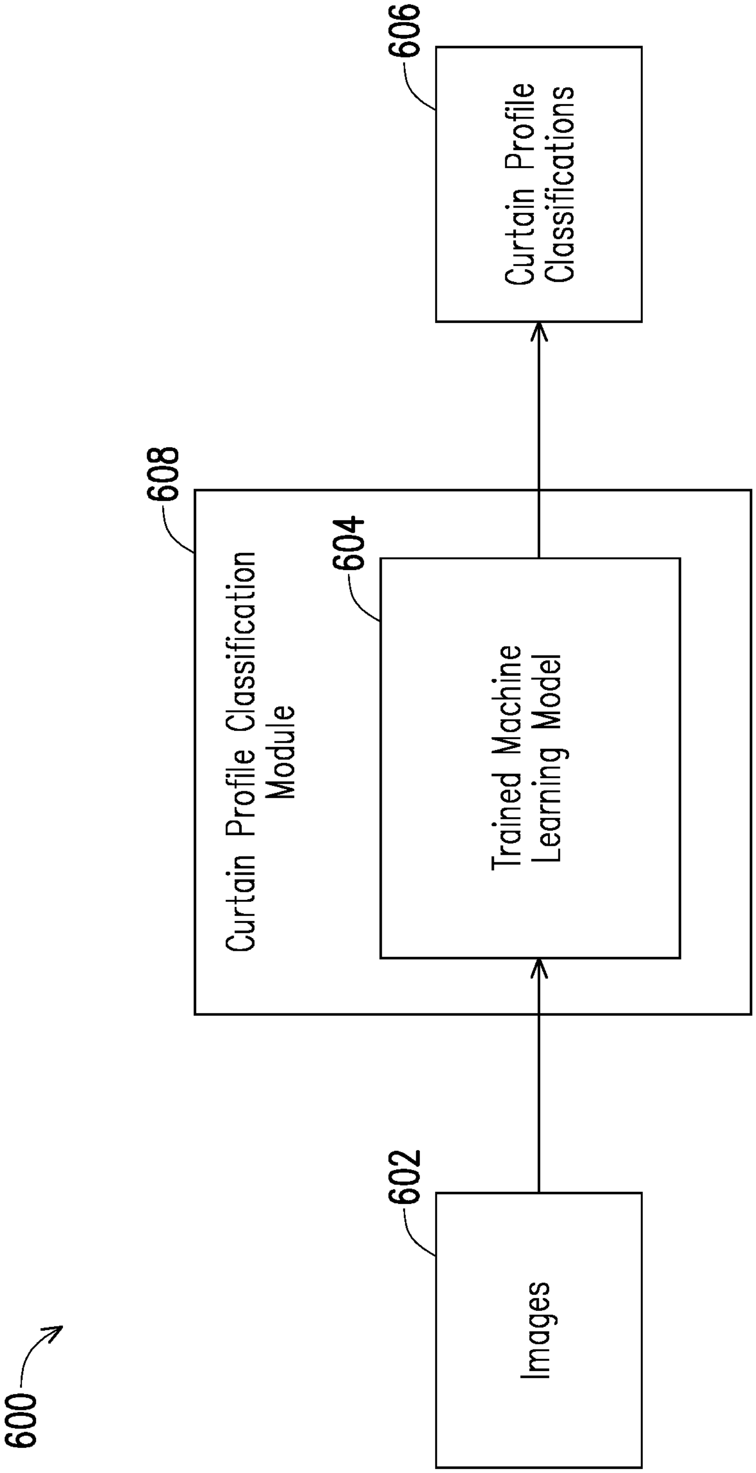
FIG. 6 illustrates a diagram of a trained machine learning model being used to determine a plurality of curtain profile classifications, in accordance with some embodiments.

FIG. 6 illustrates a diagram of a trained machine learning model 604 being used to determine the first plurality of curtain profile classifications (shown with reference number 606), according to some embodiments. In some embodiments, a curtain profile classification module 608 comprising the trained machine learning model 604 receives the first plurality of images (shown with reference number 602) as input, and uses the trained machine learning model 604 to determine the first plurality of curtain profile classifications 606. In some embodiments, a machine learning model is trained using training images to generate the trained machine learning model 604. In some embodiments, the training images comprise images of liquid distribution components dispensing liquid captured over a time period. In some embodiments, the training images are retrieved from an image data store used to store captured images of liquid distribution components. In some embodiments, the training images are generated using the error detection system. In some embodiments, the training images are generated in association with at least one of the semiconductor processing device 100 or one or more other semiconductor processing devices, such as where the training images are captured during semiconductor fabrication processes performed using one or more of the techniques shown in and/or described with respect to FIGS. 1A-1F and/or FIGS. 4A-4C. In some embodiments, at least some of the training images are labeled with curtain profile classification labels. In some embodiments, a curtain profile classification label of the curtain profile classification labels indicates whether a training image exhibits flow of liquid with the intact curtain profile or does not exhibit flow of liquid with the intact curtain profile. In some embodiments, based upon the training images and the curtain profile classification labels, the trained machine learning model 604 learns to distinguish between images that exhibit flow of liquid with the intact curtain profile and images that do not exhibit flow of liquid with the intact curtain profile.

In some embodiments, at least some of the first plurality of images 602 are at least one of captured or cropped to exclude at least some of the interior of the chamber 304 and/or at least some of the wafer 108. In some embodiments, determining a curtain profile classification of an image that excludes one or more first portions of the interior of the chamber 304 and/or one or more first portions of the wafer 108 is performed with increased accuracy and/or confidence as compared to determining a curtain profile classification of an image that includes the one or more first portions of the interior of the chamber 304 and/or the one or more first portions of the wafer 108. In some embodiments, the one or more first portions of the interior of the chamber 304 and/or the one or more first portions of the wafer 108 introduce at least one of noise, variations, complexities, etc. that can have a negative impact on determining a curtain profile classification of an image. In some embodiments, the increased accuracy and/or confidence is due, at least in part, to excluding the at least one of the noise, the variations, the complexities, etc. associated with the one or more first portions of the interior of the chamber 304 and/or the one or more first portions of the wafer 108.

In some embodiments, the trained machine learning model 604 comprises at least one of an artificial neural network, an artificial intelligence model, a pattern recognition model, a tree-based model, a machine learning model used to perform linear regression, a machine learning model used to perform logistic regression, a classification model, a decision tree model, a support vector machine (SVM), a Bayesian network model, a k-Nearest Neighbors (k-NN) model, a K-Means model, a random forest model, a machine learning model used to perform dimensional reduction, a machine learning model used to perform gradient boosting, or other machine learning model. In some embodiments, the trained machine learning model 604 is trained to perform image processing, such as at least one of image recognition, image classification, computer vision, etc., to determine a curtain profile classification of an image.

In some embodiments, the trained machine learning model 604 is updated, such as updated periodically or continuously, using newly captured training images. In some embodiments, images captured using the error detection system are used to update the trained machine learning model 604 in real time as the images are captured. In some embodiments, training and/or updating the trained machine learning model 604 comprises adjusting trainable parameters of the trained machine learning model 604 to increase an accuracy of curtain profile classifications determined using the trained machine learning model 604.

In some embodiments, the first plurality of curtain profile classifications 606 comprise at least one of (i) a first curtain profile classification associated with the first image 202 of FIG. 2A, (ii) a second curtain profile classification associated with the second image 204 of FIG. 2B, (iii) a third curtain profile classification associated with the third image 206 of FIG. 2C, (iv) a fourth curtain profile classification associated with the fourth image 208 of FIG. 2D, (v) a fifth curtain profile classification associated with the fifth image 210 of FIG. 2E, or (vi) a sixth curtain profile classification associated with the sixth image 212 of FIG. 2F. In some embodiments, at least one of (i) the first curtain profile classification associated with the first image 202 of FIG. 2A indicates the second value indicating that the first image 202 does not exhibit the processing liquid 112 flowing with the intact curtain profile, (ii) the second curtain profile classification associated with the second image 204 of FIG. 2B indicates the second value indicating that the second image 204 does not exhibit the processing liquid 112 flowing with the intact curtain profile, (iii) the third curtain profile classification associated with the third image 206 of FIG. 2C indicates the first value indicating that the third image 206 exhibits the processing liquid 112 flowing with the intact curtain profile, (iv) the fourth curtain profile classification associated with the fourth image 208 of FIG. 2D indicates the second value indicating that the fourth image 208 does not exhibit the processing liquid 112 flowing with the intact curtain profile, (v) the fifth curtain profile classification associated with the fifth image 210 of FIG. 2E indicates the first value indicating that the fifth image 210 exhibits the processing liquid 112 flowing with the intact curtain profile, or (vi) the sixth curtain profile classification associated with the sixth image 212 of FIG. 2F indicates the second value indicating that sixth image 212 does not exhibit the processing liquid 112 flowing with the intact curtain profile.

In some embodiments, the error detection system determines a first plurality of groups of images. In some embodiments, the error detection system determines the first plurality of groups based upon the first plurality of curtain profile classifications 606 and an order of the first plurality of images 602. In some embodiments, the order of the first plurality of images 602 corresponds to an order in which images of the first plurality of images 602 are received. In some embodiments, the order of the first plurality of images 602 corresponds to an ascending or descending order of image identifiers of the first plurality of images 602. In some embodiments, an image identifier of an image corresponds to a set of at least one of numbers, letters, symbols, etc. that identify the image in a data store, such as the image data store.

Figure 7A:
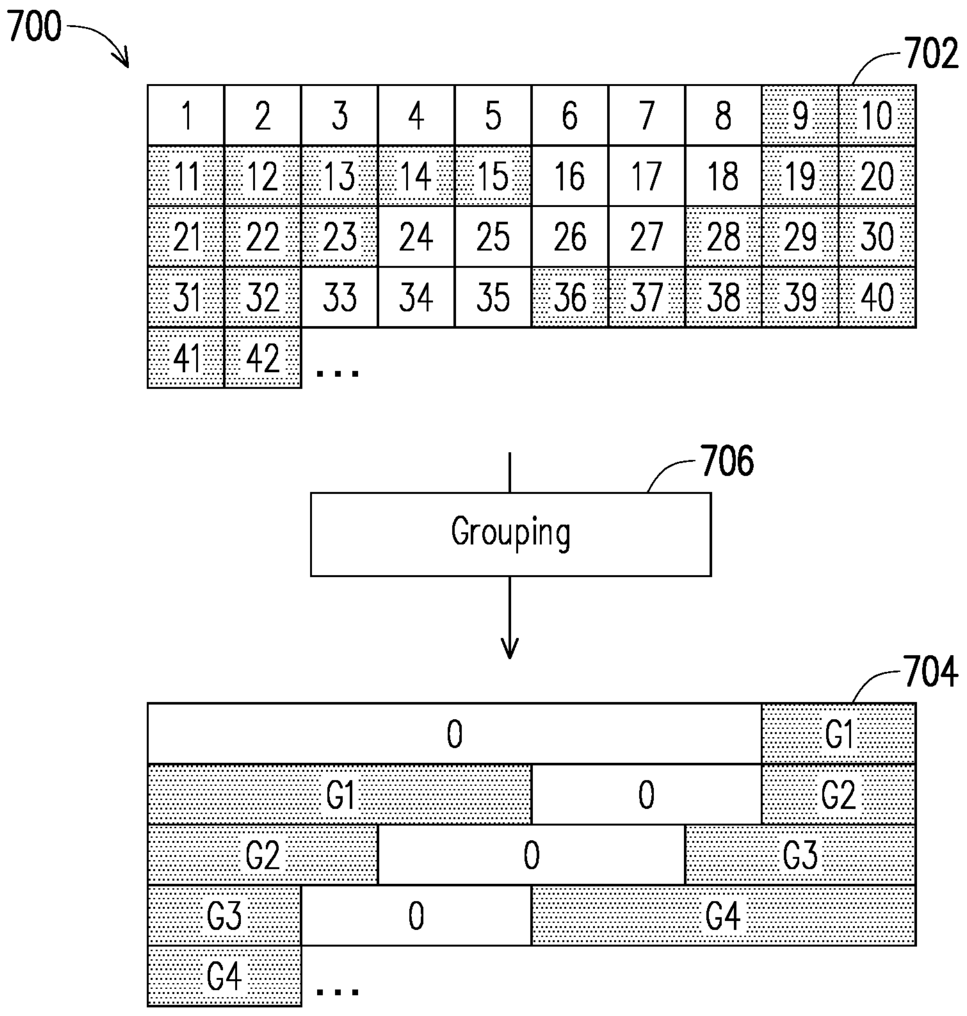
FIG. 7A illustrates a diagram of grouping a plurality of images represented by a first data structure into a plurality of groups represented by a second data structure, in accordance with some embodiments.

FIG. 7A illustrates a diagram of a scenario 700 in which the error detection system groups 706 at least some of the first plurality of images 602 represented by a first data structure 702 into the first plurality of groups represented by a second data structure 704. In some embodiments, the first data structure 702 shows sequence numbers of images according to the order of the first plurality of images 602. In some embodiments, according to the order of the first plurality of images 602, image "1" is an initial image of the first plurality of images 602 and is followed by image 2, which is followed by image 3, etc. In some embodiments, curtain profile representations are represented by boxes in the first data structure 702. In some embodiments, gray-filled boxes correspond to images, associated with the first value, that are determined to exhibit the processing liquid 112 flowing with the intact curtain profile. In some embodiments, white-filled boxes correspond to images, associated with the second value, that are determined not to exhibit the processing liquid 112 flowing with the intact curtain profile.

In some embodiments, a group of the first plurality of groups comprises images associated with curtain profile classifications that indicate the first value. In some embodiments, each group of the first plurality of groups comprises contiguous images associated with curtain profile classifications that indicate the first value. In some embodiments, each group of the first plurality of groups does not comprise any image associated with a curtain profile classification that indicates the second value. Embodiments are contemplated in which the first plurality of groups comprises groups of images associated with the second value.

In some embodiments, in FIG. 7A, the first plurality of groups comprises at least one of a first group G1, a second group G2, a third group G3, a fourth group G4, or one or more other groups. In some embodiments, the first group G1 comprises a first set of contiguous images associated with the first value, such as images 9-15 in the first data structure 702. In some embodiments, the second group G2 comprises a second set of contiguous images associated with the first value, such as images 19-25 in the first data structure 702. In some embodiments, the third group G3 comprises a third set of contiguous images associated with the first value, such as images 28-32 in the first data structure 702. In some embodiments, the fourth group G4 comprises a fourth set of contiguous images associated with the first value, such as images 36-42 in the first data structure 702.

In some embodiments, the error detection system determines a plurality of flow cycle classifications of groups of the first plurality of groups. In some embodiments, the plurality of flow cycle classifications comprises a flow cycle classification for each group of the first plurality of groups. In some embodiments, a flow cycle classification indicates a first flow cycle stage or a second flow cycle stage. In some embodiments, each flow cycle of one, some, and/or all of the plurality of flow cycles comprises the first flow cycle stage and the second flow cycle stage. In some embodiments, the first flow cycle stage spans a first part of a flow cycle from a flow activation event of the flow cycle to a time of completion of the first movement stage in which the liquid distribution component 102 moves to z-axis position $z_4$, and the second flow cycle stage spans a second part of the flow cycle from the time of completion of the first movement stage to a flow deactivation event of the flow cycle. Thus, referring back to FIGS. 1A-1F, in some embodiments, the third time associated with FIG. 1C is in the first flow cycle stage of a flow cycle, and the fifth time associated with FIG. 1E is in the second flow cycle stage of the flow cycle.

Other techniques for determining the first plurality of groups other than those explicitly provided herein are within the scope of the present disclosure.

In some embodiments, a first flow cycle of the plurality of flow cycles is performed using one or more of the techniques shown in and/or described with respect to FIGS. 1B-1F. In some embodiments, the first flow cycle is one of flow cycles 1, 2, 3, 4, 5, 6, 7, 8, or 9 shown in FIG. 4B. In some embodiments, the first plurality of images 602 comprises a first set of images captured during the first flow cycle. In some embodiments, the first set of images comprises images 1-27 in the first data structure 702. In some embodiments, images 1-8 are captured prior to a flow activation event of the first flow cycle, such as during a time period comprising the second time associated with FIG. 1B. In some embodiments, images 1-8 comprise the second image 204 in FIG. 2B and one or more other images captured before the flow activation event.

In some embodiments, images 9-15 are captured after the flow activation event and before the liquid distribution component 102 moves to a position that does not allow the image sensor 302 to view flow of the processing liquid 112 dispensed by the liquid distribution component 102. In some embodiments, images 9-15 are captured during a time period comprising the third time associated with FIG. 1C. In some embodiments, images 9-15 comprise the third image 206 in FIG. 2C. In some embodiments, images 9-15 are grouped into the first group G1 based upon curtain profile classifications of each of the images 9-15 indicating the first value. In some embodiments, a first flow cycle classification of the first group G1 indicates the first flow cycle stage based upon the images 9-15 being captured after the flow activation event and before the liquid distribution component 102 completes the first movement stage to move to z-axis position $z_4$.

In some embodiments, images 16-18 are captured after the liquid distribution component 102 completes the first movement stage to move to z-axis position $z_4$ and before the liquid distribution component 102 moves to a position that allows the image sensor 302 to view flow of the processing liquid 112 dispensed by the liquid distribution component 102. In some embodiments, images 16-18 are captured during a time period comprising the fourth time associated with FIG. 1D. In some embodiments, images 16-18 comprise the fourth image 208 in FIG. 2D and one or more other images.

In some embodiments, images 19-23 are captured (i) after the liquid distribution component 102 moves to a position that allows the image sensor 302 to view flow of the processing liquid 112 dispensed by the liquid distribution component 102, and (ii) before a flow deactivation event of the first flow cycle. In some embodiments, images 19-23 are captured during a time period comprising the fifth time associated with FIG. 1E. In some embodiments, images 19-23 comprise the fifth image 210 in FIG. 2E. In some embodiments, images 19-23 are grouped into the second group G2 based upon curtain profile classifications of each of the images 19-23 indicating the first value. In some embodiments, a second flow cycle classification of the second group G2 indicates the second flow cycle stage based upon the images 19-23 being captured after the liquid distribution component 102 completes the first movement stage to move to z-axis position $z_4$.

In some embodiments, images 24-25 are captured after the flow deactivation event of the first flow cycle. In some embodiments, images 24-25 are captured during a time period comprising the sixth time associated with FIG. 1F. In some embodiments, images 24-25 comprise the sixth image 212 in FIG. 2F.

In some embodiments, a second flow cycle of the plurality of flow cycles follows the first flow cycle. In some embodiments, the first flow cycle is flow cycle 1 and the second flow cycle is flow cycle 2 shown in FIG. 4B. In some embodiments, the first plurality of images 602 comprises a second set of images captured during the second flow cycle. In some embodiments, the second set of images comprises images 26-42 in the first data structure 702. In some embodiments, a third flow cycle classification of the third group G3 indicates the first flow cycle stage based upon images 28-32 of the third group G3 being captured after a flow activation event of the second flow cycle and before the liquid distribution component 102 completes the first movement stage to move to z-axis position $z_4$. In some embodiments, a fourth flow cycle classification of the fourth group G4 indicates the second flow cycle stage based upon the images 36-42 of the fourth group G4 being captured after the liquid distribution component 102 completes the first movement stage to move to z-axis position $z_4$.

Figure 7B:
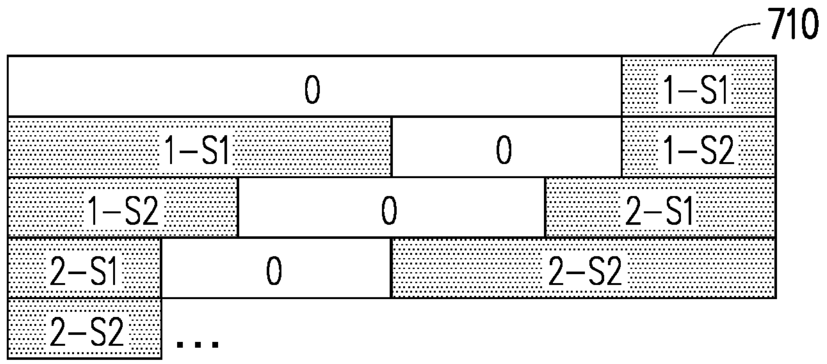
FIG. 7B illustrates a third data structure representative of a plurality of flow cycle classifications, in accordance with some embodiments.

FIG. 7B illustrates a third data structure 710 representative of the plurality of flow cycle classifications. In some embodiments, "S1" is representative of a flow cycle classification corresponding to the first flow cycle stage, and "S2" is representative of a flow cycle classification corresponding to the second flow cycle stage. In some embodiments, the first group G1 corresponds to "1-S1" which indicates that the first group G1 corresponds to the first flow cycle stage of flow cycle 1. In some embodiments, the second group G2 corresponds to "1-S2" which indicates that the second group G2 corresponds to the second flow cycle stage of flow cycle 1. In some embodiments, the third group G3 corresponds to "2-S1" which indicates that the third group G3 corresponds to the first flow cycle stage of flow cycle 2. In some embodiments, the fourth group G4 corresponds to "2-S2" which indicates that the fourth group G4 corresponds to the second flow cycle stage of flow cycle 2.

In some embodiments, the error detection system determines whether the semiconductor fabrication process is associated with a potential processing error upon the first plurality of groups. In some embodiments, the potential processing error corresponds to the processing liquid 112 flowing without the intact curtain profile during one or more flow cycles of the plurality of flow cycles, which can cause at least one of wafer defects to the wafer 108, incorrect processing of the wafer 108, etc.

In some embodiments, the error detection system determines a first quantity of groups of the first plurality of groups. In some embodiments, the error detection system compares the first quantity of groups with a first predefined quantity of groups. In some embodiments, the error detection system determines whether the semiconductor fabrication process is associated with the potential processing error based upon whether the first quantity of groups matches the first predefined quantity of groups. In some embodiments, the first predefined quantity of groups corresponds to a first predicted quantity of groups of the first plurality of groups. In some embodiments, the error detection system determines that the semiconductor fabrication process is not associated with the potential processing error based upon the first quantity of groups matching, such as being equal to, the first predefined quantity of groups. In some embodiments, the error detection system determines that the semiconductor fabrication process is associated with the potential processing error based upon the first quantity of groups not matching the first predefined quantity of groups. In some embodiments, the first predefined quantity of groups is based upon the processing profile associated with the semiconductor fabrication process. In some embodiments, the first predefined quantity of groups is based upon a quantity of flow cycles of the plurality of flow cycles. In some embodiments, the first predefined quantity of groups corresponds to a quantity of flow cycle stages, of the plurality of flow cycles, in which flow of the processing liquid 112 being dispensed by the liquid distribution component 102 is expected to be visible to the image sensor 302. In some embodiments, the first predefined quantity of groups is equal to two times the quantity of flow cycles of the plurality of flow cycles. Other values of the first predefined quantity of groups are within the scope of the present disclosure.

In some embodiments, the error detection system filters one or more groups from the first plurality of groups to determine a filtered set of groups, associated with the first value, that does not include the one or more groups. In some embodiments, the error detection system determines whether the semiconductor fabrication process is associated with the potential processing error upon the filtered set of groups.

In some embodiments, the one or more groups are filtered from the first plurality of groups based upon the one or more groups being associated with the second flow cycle stage. In some embodiments, each group of the one or more groups that are filtered from the first plurality of groups is associated with a flow cycle classification indicating the second flow cycle stage. In some embodiments, one, some and/or all groups, of the first plurality of groups, that are associated with the second flow cycle stage are filtered from the first plurality of groups and are not included in the filtered set of groups. In some embodiments, the error detection system at least one of (i) includes the first group G1 in the filtered set of groups based upon the first group G1 being associated with the first flow cycle stage, (ii) does not include the second group G2 in the filtered set of groups based upon the second group G2 being associated with the second flow cycle stage, (iii) includes the third group G3 in the filtered set of groups based upon the third group G3 being associated with the first flow cycle stage, or (iv) does not include the fourth group G4 in the filtered set of groups based upon the fourth group G4 being associated with the second flow cycle stage.

In some embodiments, the error detection system determines a second quantity of groups of the filtered set of groups. In some embodiments, the error detection system compares the second quantity of groups with a second predefined quantity of groups. In some embodiments, the error detection system determines whether the semiconductor fabrication process is associated with the potential processing error based upon whether the second quantity of groups matches the second predefined quantity of groups. In some embodiments, the second predefined quantity of groups corresponds to a second predicted quantity of groups of the filtered set of groups. In some embodiments, the error detection system determines that the semiconductor fabrication process is not associated with the potential processing error based upon the second quantity of groups matching, such as being equal to, the second predefined quantity of groups. In some embodiments, the error detection system determines that the semiconductor fabrication process is associated with the potential processing error based upon the second quantity of groups not matching the second predefined quantity of groups. In some embodiments, the second predefined quantity of groups is based upon the processing profile associated with the semiconductor fabrication process. In some embodiments, the second predefined quantity of groups is based upon, such as equal to, the quantity of flow cycles of the plurality of flow cycles. In some embodiments, the second quantity of groups of the filtered set of groups not matching the quantity of flow cycles indicates that in at least one flow cycle of the plurality of flow cycles, images, such as all images, captured during the first flow cycle stage of the flow cycle were determined to be associated with curtain profile classifications indicating the second value. In some embodiments, when the quantity of flow cycles of the plurality of flow cycles is nine, the second predefined quantity of groups compared with the second quantity of groups of the filtered set of groups is equal to nine. In some embodiments, for each flow cycle of the plurality of flow cycles, the error detection system expects the filtered set of groups to include a group of images associated with the first flow cycle stage of the flow cycle and the first value. In some embodiments, the filtered set of groups not comprising any group of images that is associated with a flow cycle of the plurality of flow cycles is reflective of the processing liquid 112 did not flow with the intact curtain profile during the flow cycle, and thus, is an indication that the semiconductor fabrication process is associated with the potential processing error. In some embodiments, the second quantity of groups being lower than the second predefined quantity of groups indicates that, for at least one flow cycle of the plurality of flow cycles, the filtered set of groups does not comprise any group of images that is associated with the flow cycle and the first value.

Other techniques for determining the filtered set of groups other than those explicitly provided herein are within the scope of the present disclosure.

In some embodiments, there is a near-zero or negligible likelihood that, after the liquid distribution component 102 has already established flow of the processing liquid 112 with the intact curtain profile after the flow activation event of a flow cycle, an event would cause the flow of the processing liquid 112 to break from and/or stop having the intact curtain profile prior to a subsequent flow deactivation event in which the liquid distribution component 102 ceases dispensing the processing liquid 112. Accordingly, in some embodiments, if it is confirmed that the processing liquid 112 flowed with the intact curtain profile during the first flow cycle stage of a flow cycle, it is unnecessary to confirm that the processing liquid 112 continues to flow with the intact curtain profile in the second flow cycle stage, such as due, at least in part, to the near-zero or negligible likelihood that an event later in the flow cycle would cause the processing liquid 112 to stop flowing with the intact curtain profile prior to a flow deactivation event of the flow cycle. Accordingly, in some embodiments, data, such as images and/or groups, associated with the second flow cycle stage introduces at least one of noise, variations, complexities, etc. that can have a negative impact on determining whether the semiconductor fabrication process performed using the semiconductor processing device 100 is associated with a potential processing error. Thus, in accordance with some embodiments, filtering groups associated with the second flow cycle stage to determine the filtered set of groups without the groups associate with the second flow cycle stage, and using the filtered set of groups to determine whether the semiconductor fabrication process is associated with the potential processing error removes at least one of the noise, the variations, the complexities, etc. associated with the second flow cycle stage. Accordingly, in some embodiments, filtering the groups associated with the second flow cycle stage enables the error detection system to determine whether the semiconductor fabrication process is associated with the potential processing error with increased accuracy and/or confidence.

Figure 8:
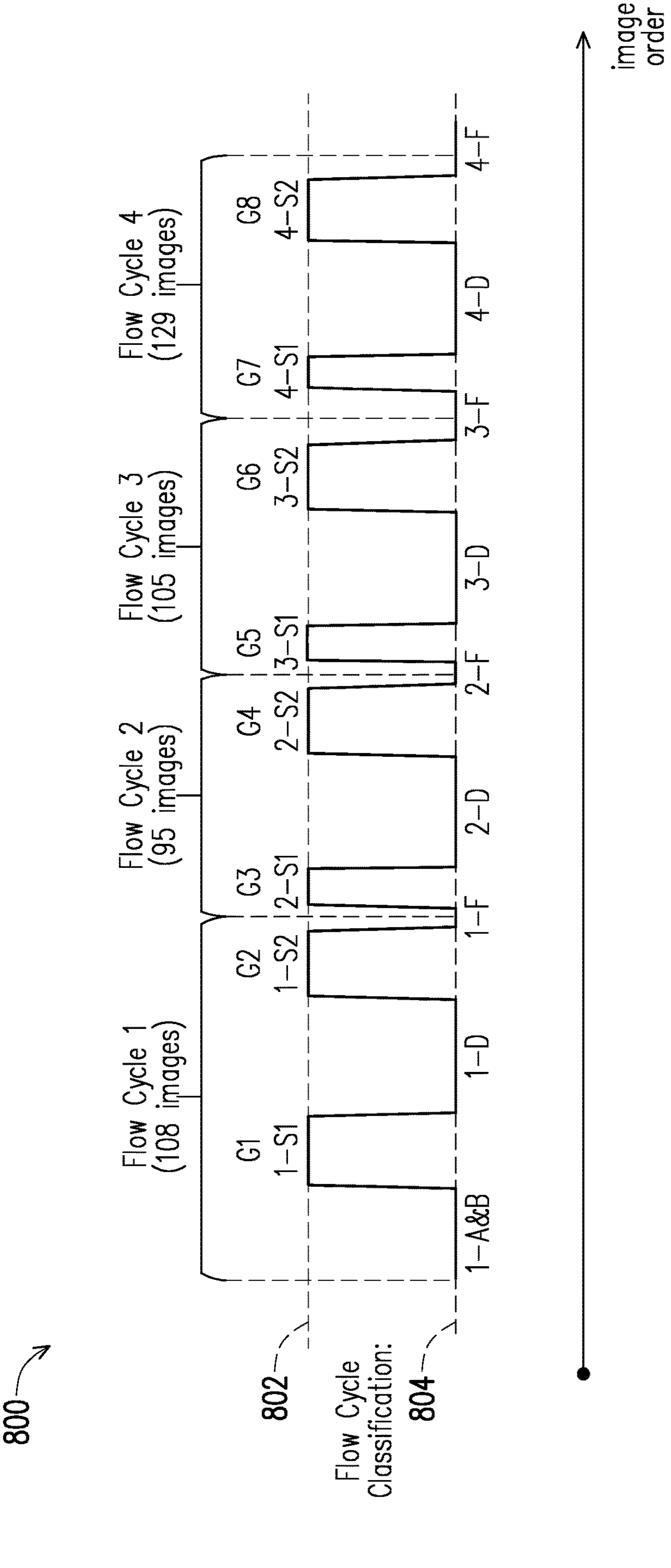
FIG. 8 illustrates a diagram of a scenario associated with capturing a plurality of images, in accordance with some embodiments.

FIG. 8 illustrates a diagram of a scenario 800 associated with capturing the first plurality of images 602. In some embodiments, FIG. 8 shows a curve corresponding to curtain profile classifications of images of the first plurality of images 602 with respect to the order of the first plurality of images 602. In some embodiments, the curve changes between the first value (shown with reference number 802) indicating an image exhibits the processing liquid 112 flowing with the intact curtain profile and the second value (shown with reference number 804) indicating an image does not exhibit the processing liquid 112 flowing with the intact curtain profile. In some embodiments, a quantity of images captured during a flow cycle is based upon a duration of time of the flow cycle and the image capture frequency. FIG. 8 shows example quantities of images captured in each flow cycle of flow cycles 1, 2, 3, and 4. Other quantities of flow cycles 1, 2, 3, and 4 are within the scope of the present disclosure. In some embodiments, groups of images associated with the second flow cycle stage, such as groups G2, G4, G6, and G8, are filtered from the first plurality of groups to determine the filtered set of groups such that the filtered set of groups does not include the groups of images. In some embodiments, the second group G2 is determined to be associated with the second flow cycle stage based upon the processing profile associated with the semiconductor fabrication process, such as based upon one or more timing parameters of one or more flow cycles of the semiconductor fabrication process. In some embodiments, a time period in which images of the second group G2 are captured is determined based upon the processing profile associated with the semiconductor fabrication process, such as based upon the one or more timing parameters. In some embodiments, images within the time period are considered to be noise since the time period is associated with the second flow cycle stage. In some embodiments, the error detection system determines a set of images, of the first plurality of images 602, that were captured during the time period associated with the second group G2. In some embodiments, the error detection system determines the set of images based upon at least one of the time period or one or more timestamps of one or more images of the first plurality of images 602. In some embodiments, the error detection system determines that the second group G2 is associated with the second flow cycle stage based upon the second group G2 comprising at least some of the set of images associated with the time period.

In some embodiments, in FIG. 8, label "1-A&B" refers to images captured in flow cycle 1 during a time period including at least one of the first time associated with FIG. 1A or the second time associated with FIG. 1B. In some embodiments, label "1-D" refers to images captured during flow cycle 1 in a time period including the fourth time associated with FIG. 1D. In some embodiments, in FIG. 8, label "1-F" refers to images captured during flow cycle 1 in a time period including the sixth time associated with FIG. 1F.

Figure 9:
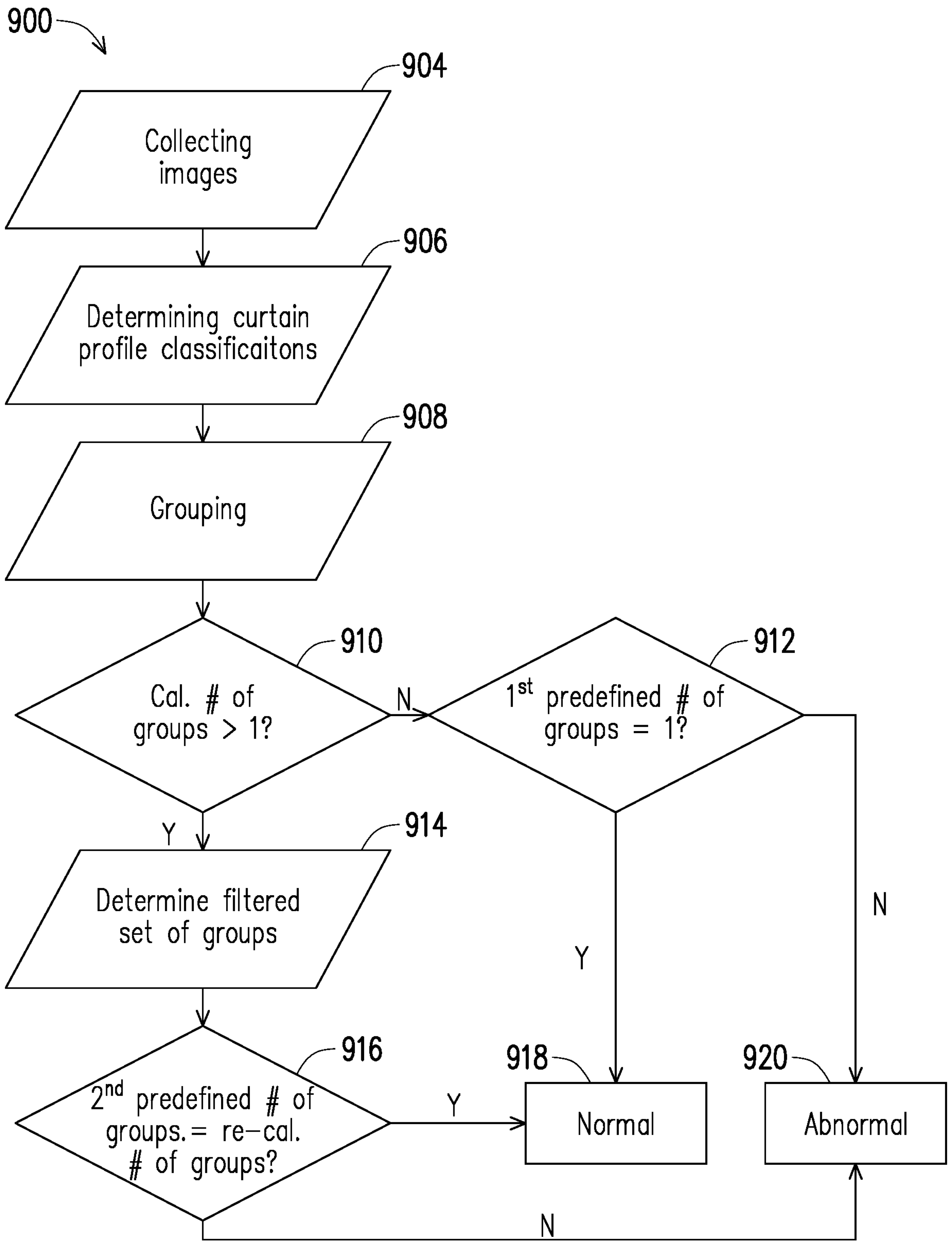
FIG. 9 is a flow diagram illustrating a method, in accordance with some embodiments.

In some embodiments, a method 900 of determining whether the semiconductor fabrication process is associated with the potential processing error is illustrated in FIG. 9 in accordance with some embodiments. At 904, the error detection system collects the first plurality of images 602. At 906, the error detection system determines the first plurality of curtain profile classifications 606 of the first plurality of images 602. At 908, the error detection system groups the first plurality of images 602 into the first plurality of groups based upon the first plurality of curtain profile classifications 606 and the order of the first plurality of images 602. At 910, the error detection system at least one of calculates the first quantity of groups of the first plurality of groups or determines whether the first quantity of groups is larger than 1.

In some embodiments, in response to determining that the first quantity of groups is not larger than 1, the error detection system determines, at 912, whether the first predefined quantity of groups is equal to 1. In some embodiments, the first predefined quantity of groups is set to 1 when the error detection system expects identifying merely a single group of images associated with the first value from the first plurality of images 602. In some embodiments, the first predefined quantity of groups is set to 1 based upon the first time period during which the first plurality of images 602 are captured covering merely a single flow cycle stage of a single flow cycle, such as shown in and/or described with respect to the third timing diagram 406 of FIG. 4C, where the image sensor 302 starts capturing images at or after time to and ceases capturing images at time $t_7$ prior to the processing liquid 112 becoming visible to the image sensor 302 in the second flow cycle stage of the single flow cycle. In some embodiments, in response to determining that the first predefined quantity of groups is equal to 1, the error detection system determines, at 918, that the semiconductor fabrication process is not associated with the potential processing error. In some embodiments, in response to determining that the first predefined quantity of groups is not equal to 1, the error detection system determines, at 920, that the semiconductor fabrication process is associated with the potential processing error.

In some embodiments, in response to determining that the first quantity of groups is larger than 1, the error detection system filters, at 914, the one or more groups from the first plurality of groups to determine the filtered set of groups. At 916, the error detection system at least one of calculates the second quantity of groups of the filtered set of groups or determines whether the second quantity of groups matches the second predefined quantity of groups. In some embodiments, in response to determining that the second quantity of groups matches the second predefined quantity of groups, the error detection system determines, at 918, that the semiconductor fabrication process is not associated with the potential processing error. In some embodiments, determining that the semiconductor fabrication process is not associated with the potential processing error corresponds to a determination that the second quantity of groups of the filtered set of groups is expected by the error detection device and/or is considered to be normal by the error detection device. In some embodiments, in response to determining that the second quantity of groups does not match the second predefined quantity of groups, the error detection system determines, at 920, that the semiconductor fabrication process is associated with the potential processing error. In some embodiments, determining that the semiconductor fabrication process is associated with the potential processing error corresponds to a determination that the second quantity of groups of the filtered set of groups is not expected by the error detection device and/or is considered to be abnormal by the error detection device.

In some embodiments, using one or more of the techniques provided herein, the error detection system determines that the semiconductor fabrication process is associated with the potential processing error. In some embodiments, the error detection system performs one or more corrective actions in response to determining that the semiconductor fabrication process is associated with the potential processing error.

In some embodiments, in response to determining that the semiconductor fabrication process is associated with the potential processing error, the error detection system displays an alert, indicative of the potential processing error, via a display. In some embodiments, in response to determining that the semiconductor fabrication process is associated with the potential processing error, the error detection system provides a signal indicative of the potential processing error. In some embodiments, the error detection system transmits the signal to a processing error alert system. In some embodiments, the processing error alert system triggers an alarm based upon the signal. In some embodiments, the processing error alert system triggers the alarm based upon the signal indicating that the semiconductor fabrication process is associated with the potential processing error. In some embodiments, in response to triggering the alarm, an alarm message is displayed via a display of the processing error alert system. The alarm message comprises at least one of (i) an indication that the semiconductor fabrication process is associated with the potential processing error, (ii) identification of one or more wafers, such as the wafer 108, processed using the semiconductor processing device 100, (iii) an indication that the one or more wafers shall be at least one of checked for defects, repaired, scrapped, etc. due to the potential processing error, (iv) identification of the semiconductor processing device 100, (v) identification of a location of the semiconductor processing device 100, (vi) an indication that the semiconductor processing device 100 is not available for use, or (vii) other information. In some embodiments, an alarm sound is output via a speaker connected to the processing error alert system in response to triggering the alarm.

In some embodiments, in response to determining that the semiconductor fabrication process is associated with the potential processing error, the error detection system schedules one or more maintenance events for at least one of the semiconductor processing device 100 or one or more wafers, such as the wafer 108, processed using the semiconductor processing device 100. In some embodiments, the wafer 108 is checked for defects. In some embodiments, wafer defects of the wafer 108 are repaired. In some embodiments, after repairing the wafer defects of the wafer 108, a second semiconductor fabrication process is performed on the wafer 108. In some embodiments, the second semiconductor fabrication process comprises one, some and/or all acts of the semiconductor fabrication process.

In some embodiments, in response to determining that the semiconductor fabrication process is associated with the potential processing error, the error detection system controls the semiconductor processing device 100 to at least one of cease operation, change modes, block one or more functions, or other action, that prevent the semiconductor processing device 100 from causing damage to one or more wafers and/or semiconductor processing equipment.

In some embodiments, in response to determining that the semiconductor fabrication process is associated with the potential processing error, images (of the first plurality of images 602) and curtain profile classifications (of the first plurality of curtain profile classifications 606) that were used to make the determination that the semiconductor fabrication process is associated with the potential processing error are rechecked, such as manually, to determine whether the curtain profile classifications are correct classifications.

In some embodiments, the potential processing error is determined to be a false flag if it is determined that the processing liquid 112 flowed with the intact curtain profile throughout flow cycles of the semiconductor fabrication process. In some embodiments, the false flag is due to at least some of the curtain profile classifications being determined incorrectly. In some embodiments, curtain profile classifications that were determined incorrectly using the trained machine learning model 604 are identified, and corrected versions of the curtain profile classifications are used, in conjunction with images associated with the curtain profile classifications, to update the trained machine learning model 604. In some embodiments, updating the trained machine learning model 604 with a corrected version of an incorrect curtain profile classification and an image associated with the incorrect curtain profile classification teaches the trained machine learning model 604 that the image that the trained machine learning model 604 incorrectly classified as not exhibiting the processing liquid 112 flowing with the intact curtain profile, for example, actually exhibits the processing liquid 112 flowing with the intact curtain profile, thereby improving the trained machine learning model 604 over time.

Other techniques for determining whether the semiconductor fabrication process is associated with the potential processing error based upon at least one of the first plurality of groups, the filtered set of groups, the first quantity of groups, or the second quantity of groups other than those explicitly provided herein are within the scope of the present disclosure.

Figure 10:
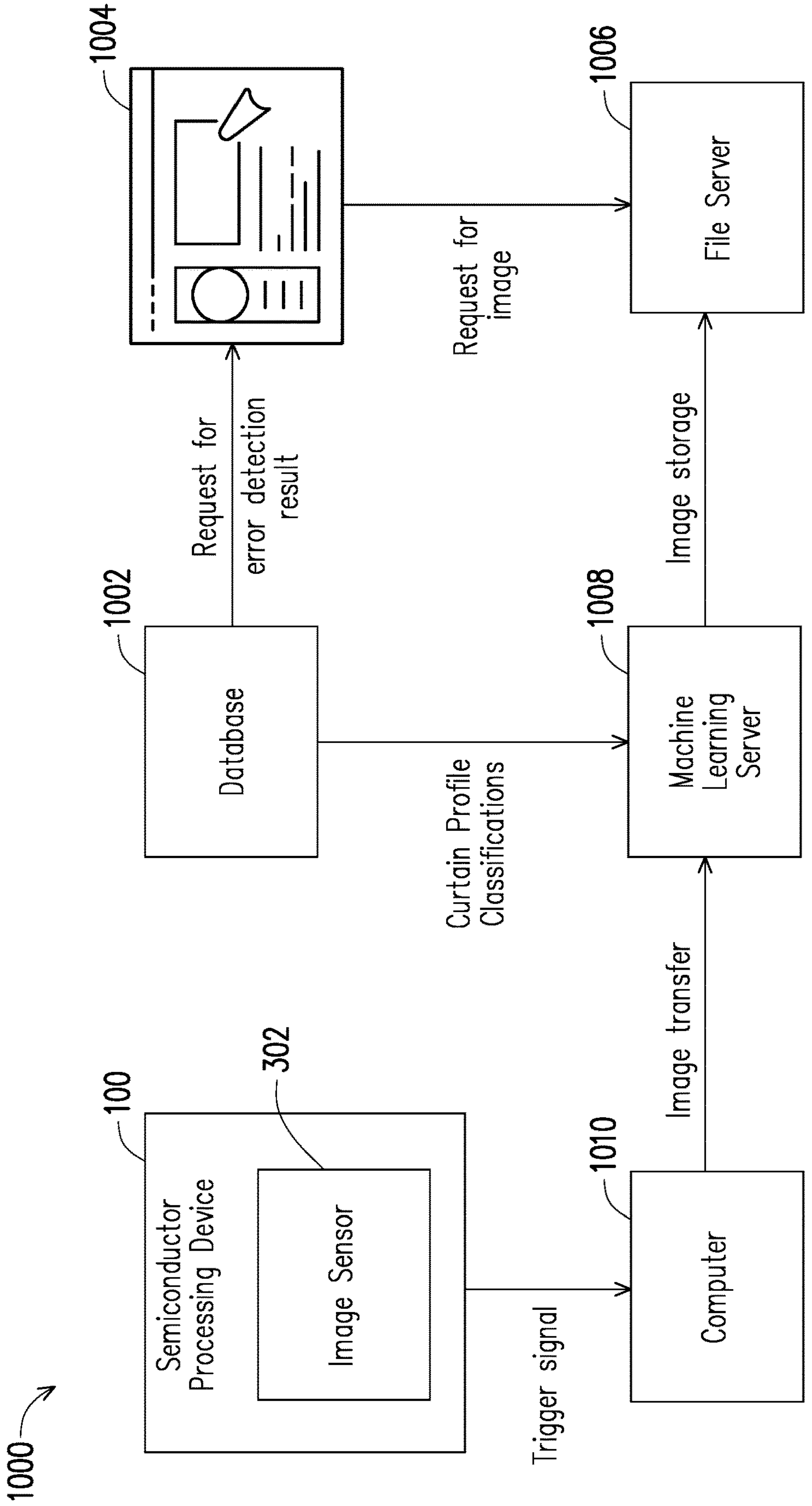
FIG. 10 illustrates a schematic view of an error detection system, in accordance with some embodiments.

FIG. 10 illustrates a schematic view of the error detection system (shown with reference number 1000), in accordance with some embodiments. In some embodiments, the error detection system 1000 comprises at least one of the image sensor 302, a computer 1010, a database 1002, a machine learning server 1008 hosting the trained machine learning model 604, a file server 1006, or an application 1004, such as at least one of a mobile application, a web application, etc. that provides a user interface. In some embodiments, the semiconductor processing device 100 transmits a trigger signal to the computer 1010. In some embodiments, the trigger signal indicates a start time of the semiconductor fabrication process. In some embodiments, in response to the trigger signal, the computer 1010 controls the image sensor 302 to start capturing images of the first plurality of images 602. In some embodiments, the computer 1010 is connected to the image sensor 302 over a wired or wireless connection.

In some embodiments, the computer 1010 transfers the first plurality of images 602 to the machine learning server 1008. In some embodiments, the machine learning server 1008 runs the trained machine learning model 604 to determine the first plurality of curtain profile classifications 606. In some embodiments, the first plurality of curtain profile classifications 606 are provided to the database 1002, which determines whether the semiconductor fabrication process is associated with the potential processing error using one or more of the technique provided herein. In some embodiments, the machine learning server 1008 provides the first plurality of images 602 for storage, such as temporary storage, on the file server 1006. In some embodiments, the first application 1004 sends a request for an error detection result to the database 1002. In some embodiments, in response to the request, the database 1002 provides the first application 1004 with an indication of whether the semiconductor fabrication process is associated with the potential processing error. In some embodiments, the first application 1004 sends a request for an image of the first plurality of images 602 to the file server 1006. In some embodiments, in response to the request, the file server 1006 provides the first application 1004 with the image.

Figure 11:
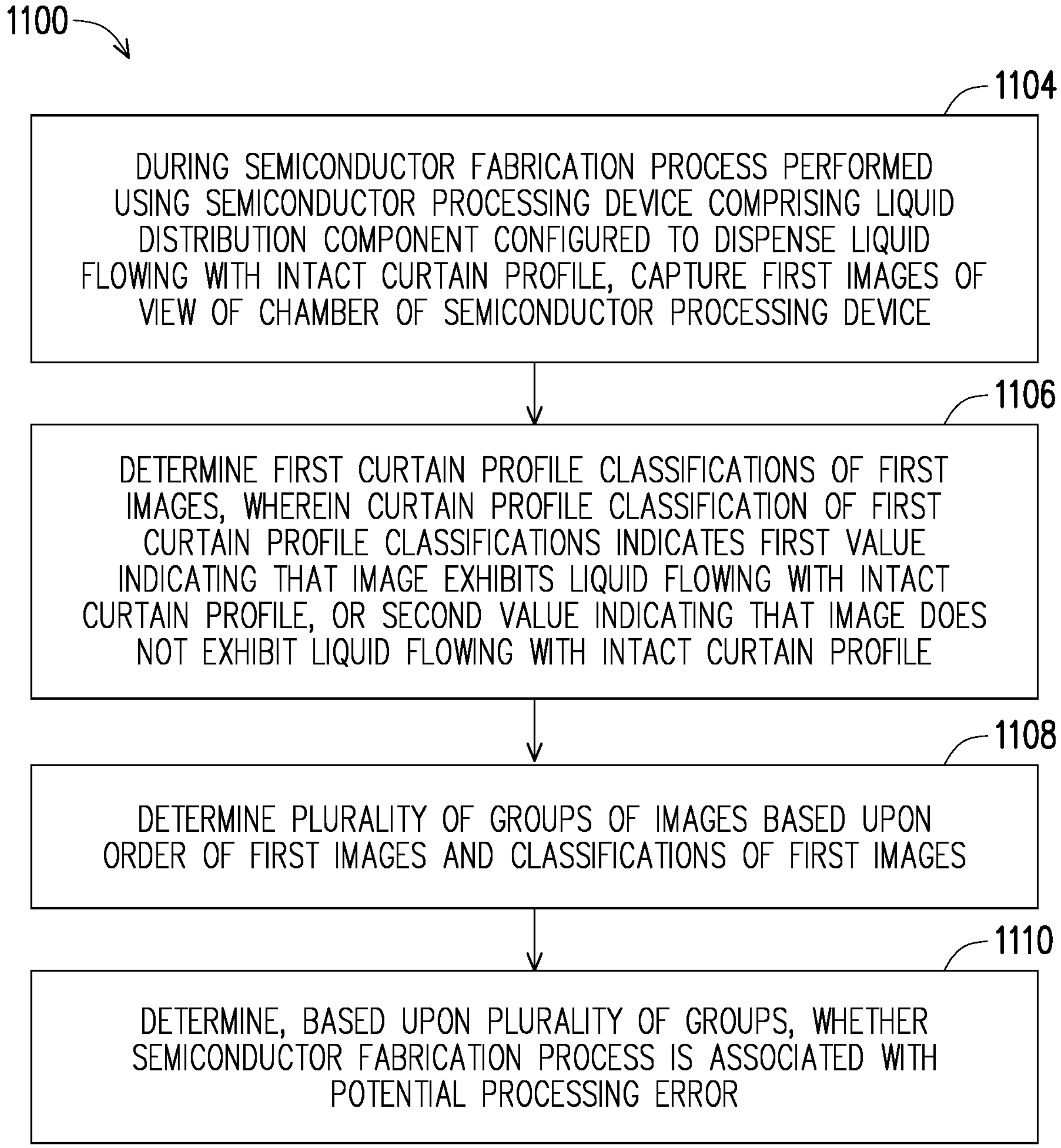
FIG. 11 is a flow diagram illustrating a method, in accordance with some embodiments.

In some embodiments, a method 1100 is illustrated in FIG. 11 in accordance with some embodiments. At 1104, during a semiconductor fabrication process performed using a semiconductor processing device, first images of a view of a chamber of the semiconductor processing device are captured. The semiconductor processing device comprises a liquid distribution component configured to dispense a liquid flowing with an intact curtain profile. At 1106, first curtain profile classifications of the first images are determined. A curtain profile classification of the first curtain profile classifications indicates a first value indicating that an image exhibits the liquid flowing with the intact curtain profile or a second value indicating that the image does not exhibit the liquid flowing with the intact curtain profile. At 1108, a plurality of groups of images is determined based upon an order of the first images and the first curtain profile classifications of the first images. At 1110, whether the semiconductor fabrication process is associated with a potential processing error is determined based upon the plurality of groups.

Figure 12:
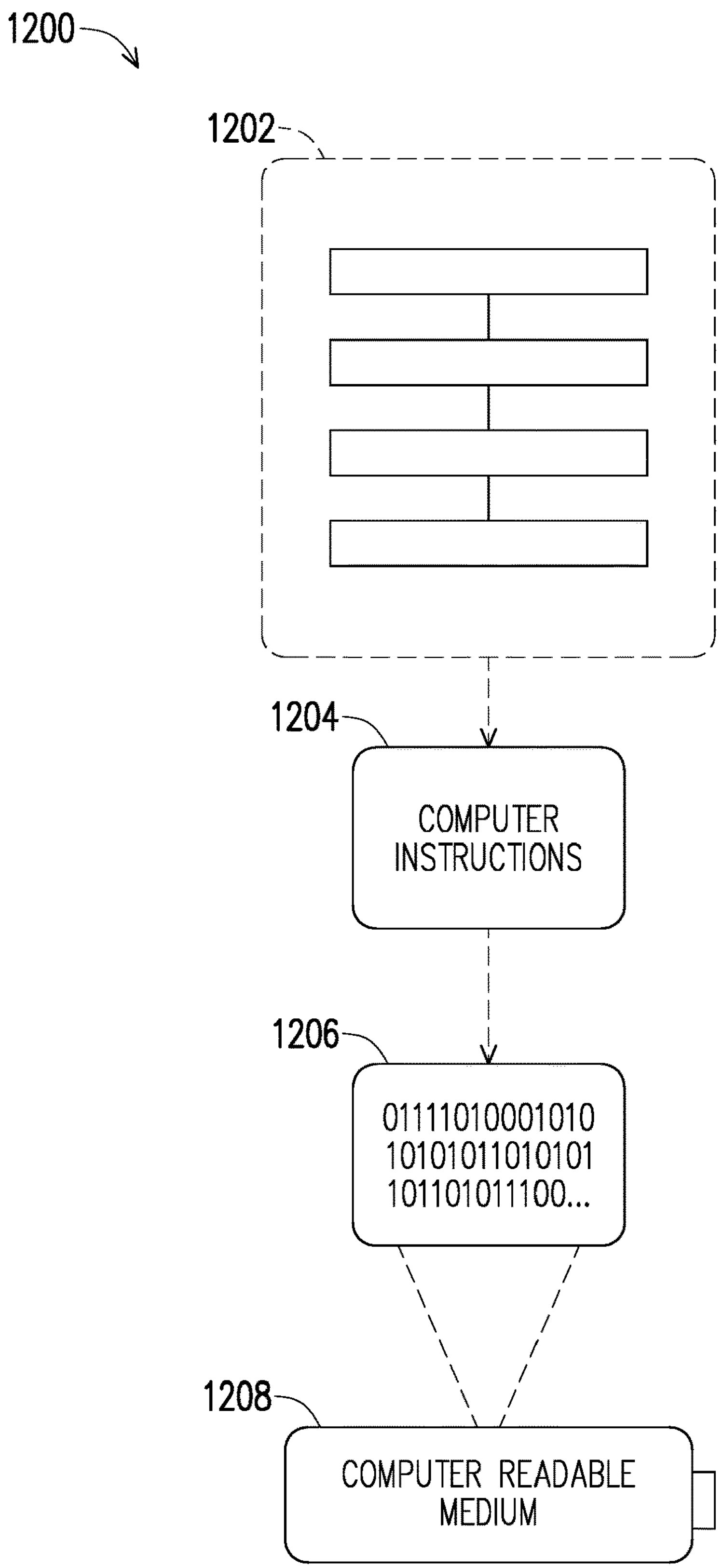
FIG. 12 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 12, wherein the embodiment 1200 comprises a computer-readable medium 1208 (e.g., a CD-R, DVD-R, flash drive, a platter of a hard disk drive, etc.), on which is encoded computer-readable data 1206. This computer-readable data 1206 in turn comprises a set of processor-executable computer instructions 1204 configured to implement one or more of the principles set forth herein when executed by a processor. In some embodiments 1200, the processor-executable computer instructions 1204 are configured to implement a method 1202, such as at least some of the aforementioned method(s) when executed by a processor. In some embodiments, the processor-executable computer instructions 1204 are configured to implement a system, such as at least some of the one or more aforementioned systems when executed by a processor. In some embodiments, the processor-executable computer instructions 1204 are configured to implement an apparatus, such as at least some of the one or more aforementioned apparatuses when executed by a processor. Many such computer-readable media may be devised by those of ordinary skill in the art that are configured to operate in accordance with the techniques presented herein.

In some embodiments, a method is provided. The method includes capturing, during a semiconductor fabrication process performed using a semiconductor processing device, first images of a view of a chamber of the semiconductor processing device. The semiconductor processing device comprises a liquid distribution component configured to dispense a liquid flowing with an intact curtain profile. The method includes determining first curtain profile classifications of the first images. A curtain profile classification of the first curtain profile classifications indicates a first value indicating that an image exhibits the liquid flowing with the intact curtain profile, or a second value indicating that the image does not exhibit the liquid flowing with the intact curtain profile. The method includes determining a plurality of groups of images based upon an order of the first images and the first curtain profile classifications of the first images. The method includes determining, based upon the plurality of groups, whether the semiconductor fabrication process is associated with a potential processing error.

In some embodiments, a method is provided. The method includes during a photomask development process performed to develop a photomask on a wafer in a chamber of a semiconductor processing device, capturing first images of a view of the chamber. The semiconductor processing device comprises a liquid distribution component configured to dispense a developer liquid flowing with an intact curtain profile. The method includes determining first curtain profile classifications of the first images, wherein each curtain profile classification of the first curtain profile classifications indicates a first value indicating that an image exhibits the developer liquid flowing with the intact curtain profile, or a second value indicating that the image does not exhibit the developer liquid flowing with the intact curtain profile. The method includes determining a plurality of groups of images based upon an order of the first images and the first curtain profile classifications of the first images. The method includes determining, based upon the plurality of groups, whether the photomask development process is associated with a potential processing error.

In some embodiments, a method is provided. The method includes capturing, during a semiconductor fabrication process performed using a semiconductor processing device, first images of a view of a chamber of the semiconductor processing device. The semiconductor processing device comprises a liquid distribution component configured to dispense a liquid flowing with an intact curtain profile. The method includes determining, using a trained machine learning model, first curtain profile classifications of the first images. A curtain profile classification of the first curtain profile classifications indicates a first value indicating that an image exhibits the liquid flowing with the intact curtain profile, or a second value indicating that the image does not exhibit the liquid flowing with the intact curtain profile. The method includes determining, based upon an order of the first images and the first curtain profile classifications of the first images, a plurality of groups of images associated with the first value, wherein each group of the plurality of groups comprises contiguous images associated with curtain profile classifications that indicate the first value. The method includes determining, based upon the plurality of groups, whether the semiconductor fabrication process is associated with a potential processing error.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method, comprising:

during a semiconductor fabrication process performed using a semiconductor processing device comprising a liquid distribution component configured to dispense a liquid flowing with an intact curtain profile, capturing first images of a view of a chamber of the semiconductor processing device;

determining first curtain profile classifications of the first images, wherein a curtain profile classification of the first curtain profile classifications indicates:

a first value indicating that an image exhibits the liquid flowing with the intact curtain profile; or a second value indicating that the image does not exhibit the liquid flowing with the intact curtain profile;

determining a plurality of groups of images based upon an order of the first images and the first curtain profile classifications of the first images;

determining, based upon the plurality of groups, whether the semiconductor fabrication process is associated with a potential processing error, wherein determining whether the semiconductor fabrication process is associated with the potential processing error comprises:

filtering one or more groups from the plurality of groups to determine a filtered set of groups associated with the first value; and comparing a quantity of groups of the filtered set of groups with a predefined quantity of groups; and in response to determining that the semiconductor fabrication process is associated with the potential processing error, at least one of:

displaying an alert, indicative of the potential processing error, via a display; or providing a signal indicative of the potential processing error.

2. The method of claim 1, wherein determining the first curtain profile classifications comprises:

determining the first curtain profile classifications using a trained machine learning model.

3. The method of claim 2, comprising:

capturing a training image exhibiting flow of liquid with the intact curtain profile; and training a machine learning model using the training image to generate the trained machine learning model.

4. The method of claim 1, wherein:

each group of the plurality of groups comprises contiguous images associated with curtain profile classifications that indicate the first value.

5. The method of claim 1, wherein:

the semiconductor fabrication process is determined to not be associated with the potential processing error based upon the quantity of groups of the filtered set of groups matching the predefined quantity of groups.

6. The method of claim 1, wherein:

the semiconductor fabrication process comprises a plurality of flow cycles, wherein each flow cycle of the plurality of flow cycles comprises:

a flow activation event in which the liquid distribution component starts dispensing the liquid; and a flow deactivation event in which the liquid distribution component ceases dispensing the liquid; and the predefined quantity of groups is equal to a quantity of flow cycles of the plurality of flow cycles.

7. The method of claim 1, wherein:

the semiconductor fabrication process is determined to be associated with the potential processing error based upon the quantity of groups of the filtered set of groups not matching the predefined quantity of groups.

8. The method of claim 1, wherein:

the liquid treats a wafer in the chamber.

9. The method of claim 1, wherein:

the semiconductor fabrication process comprises a flow cycle comprising:

a flow activation event in which the liquid distribution component starts dispensing the liquid; and a flow deactivation event in which the liquid distribution component ceases dispensing the liquid;

the plurality of groups comprise:

a first group of images captured in a first time period after the flow activation event and before the flow deactivation event, wherein each image of the first group of images is associated with the first value; and a second group of images captured during a second time period after the first time period and before the flow deactivation event, wherein each image of the second group of images is associated with the first value; and filtering the one or more groups from the plurality of groups to determine the filtered set of groups comprises filtering the second group of images such that the filtered set of groups does not include the second group of images.

10. The method of claim 9, wherein:

after the flow activation event and before the flow deactivation event, the semiconductor fabrication process comprises:

a first movement stage in which the liquid distribution component moves from a first position to a second position along a first path overlying a wafer in the chamber; and a second movement stage in which the liquid distribution component moves from the second position to the first position along a second path overlying the wafer; and the second group of images are captured during the second movement stage.

11. A method, comprising:

during a photomask development process performed to develop a photomask on a wafer in a chamber of a semiconductor processing device comprising a liquid distribution component configured to dispense a developer liquid flowing with an intact curtain profile, capturing first images of a view of the chamber;

determining first curtain profile classifications of the first images, wherein each curtain profile classification of the first curtain profile classifications indicates:

a first value indicating that an image exhibits the developer liquid flowing with the intact curtain profile; or a second value indicating that the image does not exhibit the developer liquid flowing with the intact curtain profile;

determining a plurality of groups of images based upon an order of the first images and the first curtain profile classifications of the first images;

determining, based upon the plurality of groups, whether the photomask development process is associated with a potential processing error, wherein determining whether the photomask development process is associated with the potential processing error comprises:

filtering one or more groups from the plurality of groups to determine a filtered set of groups associated with the first value; and comparing a quantity of groups of the filtered set of groups with a predefined quantity of groups; and in response to determining that the photomask development process is associated with the potential processing error, at least one of:

displaying an alert, indicative of the potential processing error, via a display; or providing a signal indicative of the potential processing error.

12. The method of claim 11, wherein determining the first curtain profile classifications comprises:

determining the first curtain profile classifications using a trained machine learning model.

13. The method of claim 12, comprising:

capturing a training image exhibiting flow of liquid with the intact curtain profile; and training a machine learning model using the training image to generate the trained machine learning model.

14. The method of claim 11, wherein:

each group of the plurality of groups comprises contiguous images associated with curtain profile classifications that indicate the first value.

15. A method, comprising:

during a semiconductor fabrication process performed using a semiconductor processing device comprising a liquid distribution component configured to dispense a liquid flowing with an intact curtain profile, capturing first images of a view of a chamber of the semiconductor processing device;

determining, using a trained machine learning model, first curtain profile classifications of the first images, wherein a curtain profile classification of the first curtain profile classifications indicates:

a first value indicating that an image exhibits the liquid flowing with the intact curtain profile; or a second value indicating that the image does not exhibit the liquid flowing with the intact curtain profile;

determining, based upon an order of the first images and the first curtain profile classifications of the first images, a plurality of groups of images associated with the first value, wherein each group of the plurality of groups comprises contiguous images associated with curtain profile classifications that indicate the first value;

determining, based upon the plurality of groups, whether the semiconductor fabrication process is associated with a potential processing error, wherein determining whether the semiconductor fabrication process is associated with the potential processing error comprises:

filtering one or more groups from the plurality of groups to determine a filtered set of groups associated with the first value; and comparing a quantity of groups of the filtered set of groups with a predefined quantity of groups; and in response to determining that the semiconductor fabrication process is associated with the potential processing error, at least one of:

displaying an alert, indicative of the potential processing error, via a display; or providing a signal indicative of the potential processing error.

16. The method of claim 15, comprising:

capturing a training image exhibiting flow of liquid with the intact curtain profile; and training a machine learning model using the training image to generate the trained machine learning model.

17. The method of claim 15, wherein:

the semiconductor fabrication process comprises a plurality of flow cycles, wherein each flow cycle of the plurality of flow cycles comprises:

a flow activation event in which the liquid distribution component starts dispensing the liquid; and a flow deactivation event in which the liquid distribution component ceases dispensing the liquid; and the predefined quantity of groups is equal to a quantity of flow cycles of the plurality of flow cycles.

18. The method of claim 15, wherein:

the semiconductor fabrication process is determined to be associated with the potential processing error based upon the quantity of groups of the filtered set of groups not matching the predefined quantity of groups.

19. The method of claim 15, wherein:

the semiconductor fabrication process is determined to not be associated with the potential processing error based upon the quantity of groups of the filtered set of groups matching the predefined quantity of groups.

20. The method of claim 15, wherein:

the semiconductor fabrication process comprises a flow cycle comprising:

a flow activation event in which the liquid distribution component starts dispensing the liquid; and a flow deactivation event in which the liquid distribution component ceases dispensing the liquid;

the plurality of groups comprise:

a first group of images captured in a first time period after the flow activation event and before the flow deactivation event, wherein each image of the first group of images is associated with the first value; and a second group of images captured during a second time period after the first time period and before the flow deactivation event, wherein each image of the second group of images is associated with the first value; and filtering the one or more groups from the plurality of groups to determine the filtered set of groups comprises filtering the second group of images such that the filtered set of groups does not include the second group of images.

* * * * *